United States Patent
Nakaoka et al.

(10) Patent No.: US 6,815,255 B2
(45) Date of Patent: Nov. 9, 2004

(54) SEMICONDUCTOR DEVICE AND MANUFACTURING METHOD THEREOF

(75) Inventors: Yukiko Nakaoka, Ikoma (JP); Kazuhiko Matsumura, Kitakatsuragi-gun (JP); Hideyuki Kaneko, Itami (JP); Koichi Nagao, Kyoto (JP); Hiroaki Fujimoto, Hirakata (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/621,305

(22) Filed: Jul. 18, 2003

(65) Prior Publication Data

US 2004/0029314 A1 Feb. 12, 2004

Related U.S. Application Data

(62) Division of application No. 10/062,535, filed on Feb. 5, 2002, now abandoned.

(30) Foreign Application Priority Data

Aug. 8, 2001 (JP) ........................................ 2001-240844

(51) Int. Cl.[7] .......................... H01L 21/48; H01L 21/50; H01L 21/30
(52) U.S. Cl. ...................... 438/108; 438/109; 438/113; 438/127; 438/458
(58) Field of Search ................................. 438/106, 107, 438/108, 109, 110, 112, 113, 118, 127, 455, 458, 459, 460

(56) References Cited

U.S. PATENT DOCUMENTS

| | | |
|---|---|---|
| 5,830,800 A | 11/1998 | Lin |
| 5,930,599 A * | 7/1999 | Fujimoto et al. ........... 438/113 |
| 6,060,373 A | 5/2000 | Saitoh |
| 6,174,751 B1 | 1/2001 | Oka |
| 6,400,036 B1 | 6/2002 | Tang et al. |

* cited by examiner

Primary Examiner—David Zarneke
Assistant Examiner—Scott B. Geyer
(74) Attorney, Agent, or Firm—Nixon Peabody, LLP; Donald R. Studebaker

(57) ABSTRACT

A semiconductor device includes a first semiconductor chip provided with a first electrode on a first main surface and a second semiconductor chip provided with a second electrode on a second main surface. The first and the second semiconductor chips are integrated so that the first and second main surfaces are opposed to one another and the first and second electrodes are electrically connected. The second semiconductor chip is polished from the opposite side of the second main surface so that the second semiconductor chip has a thickness smaller than the thickness of the first semiconductor chip.

3 Claims, 20 Drawing Sheets

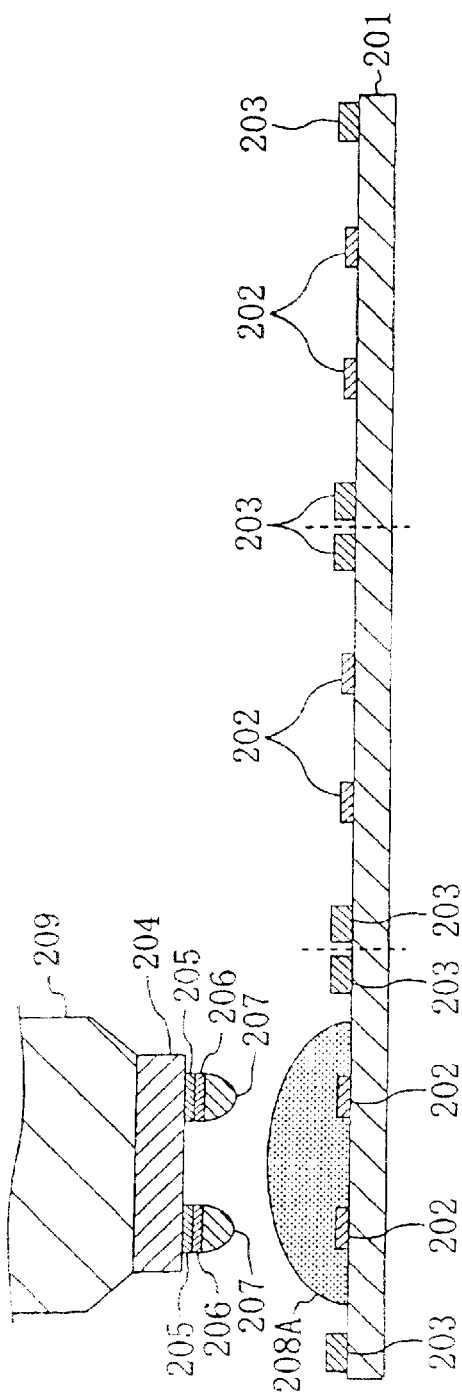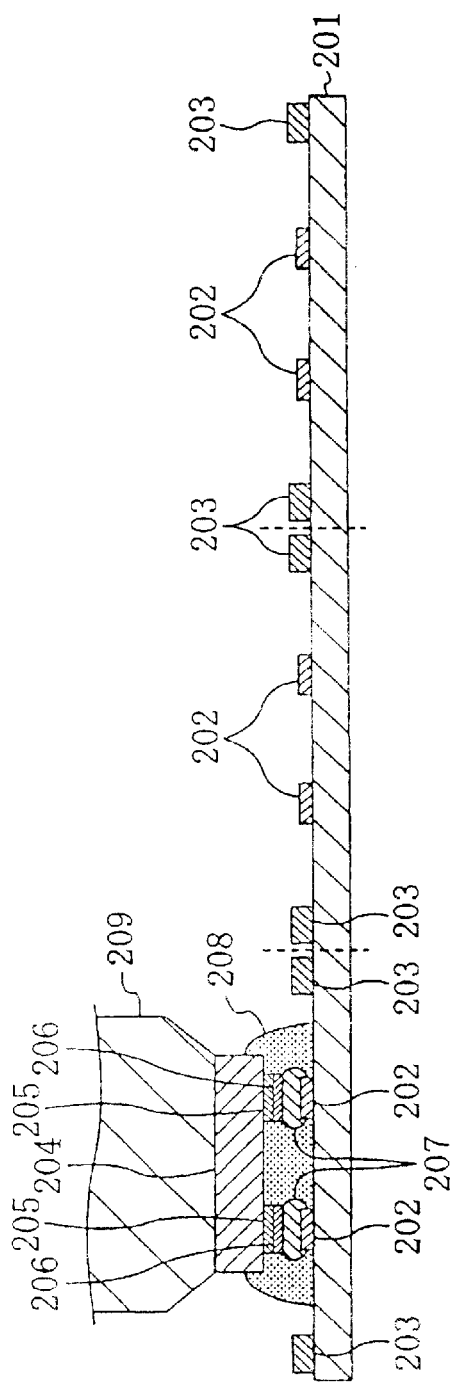
FIG. 4A
FIG. 4B

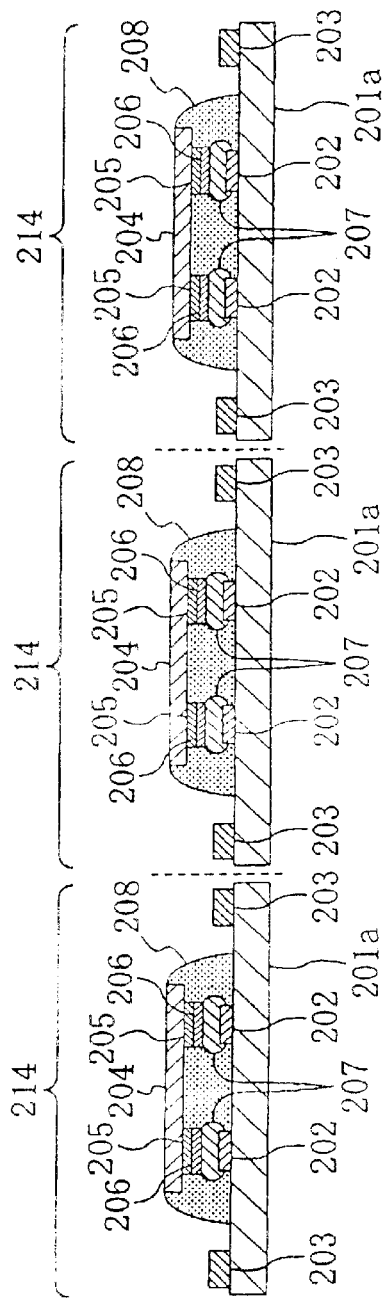
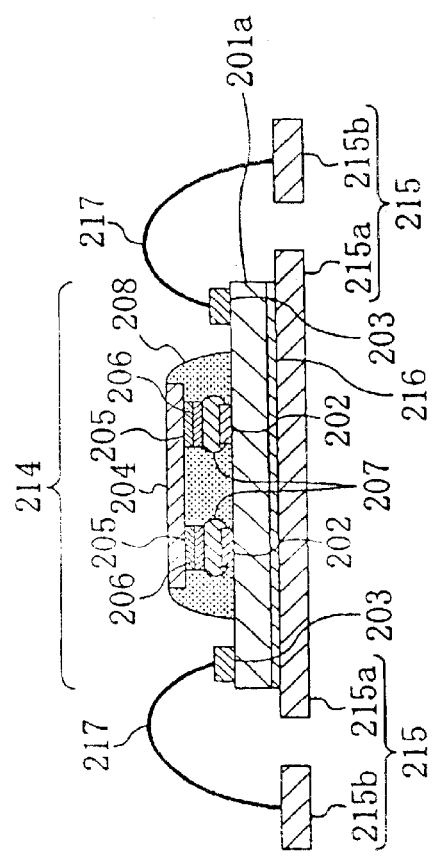
FIG. 6A
FIG. 6B

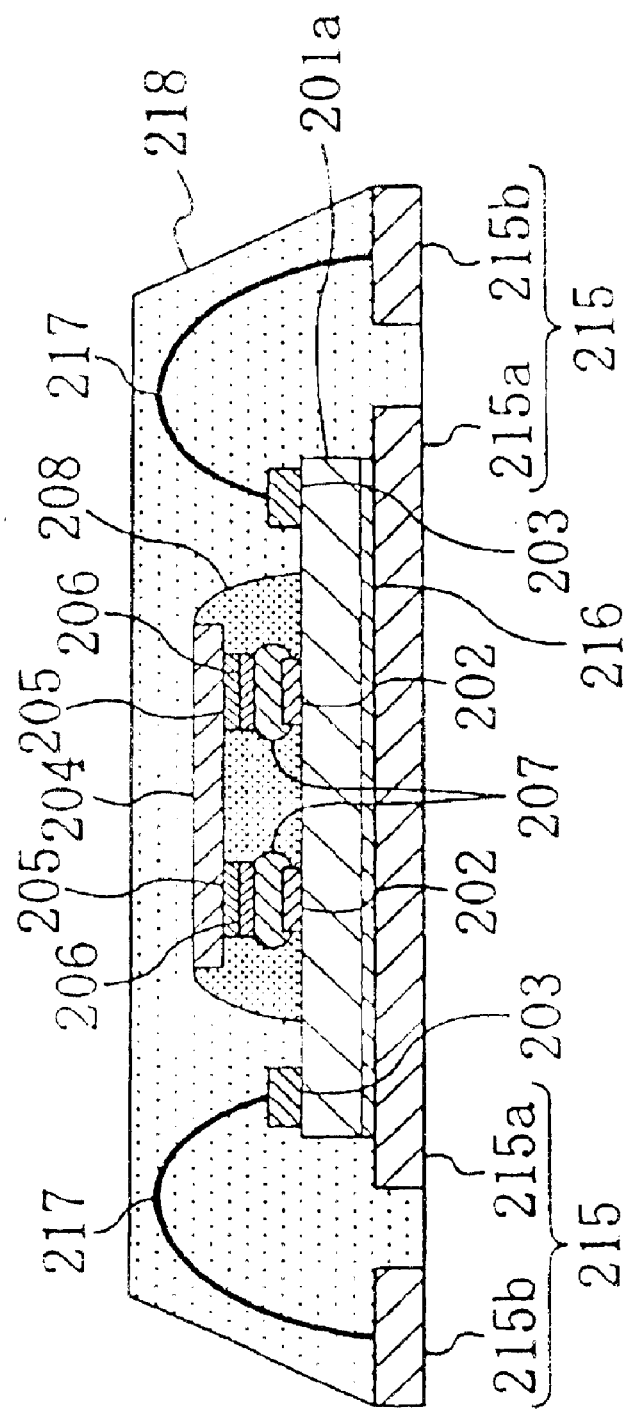

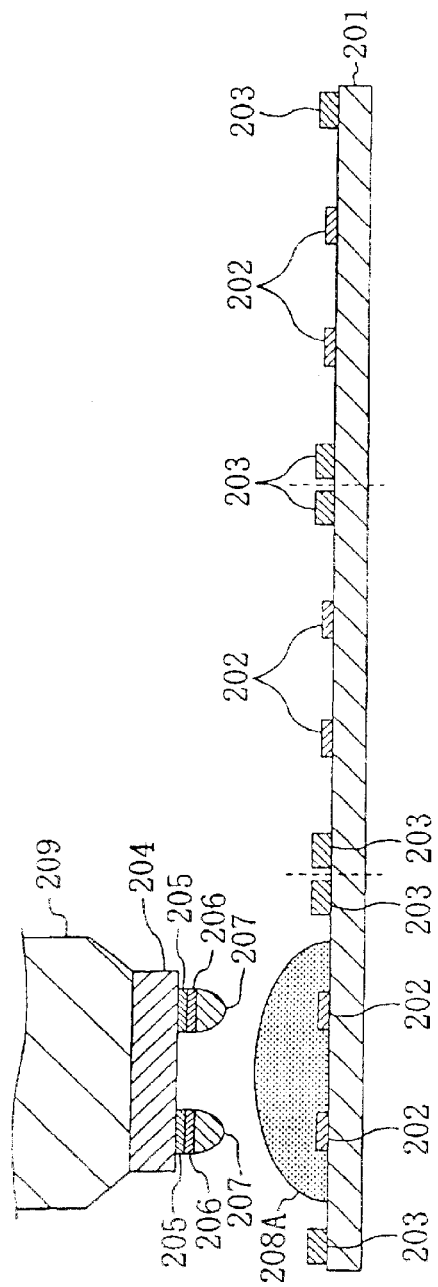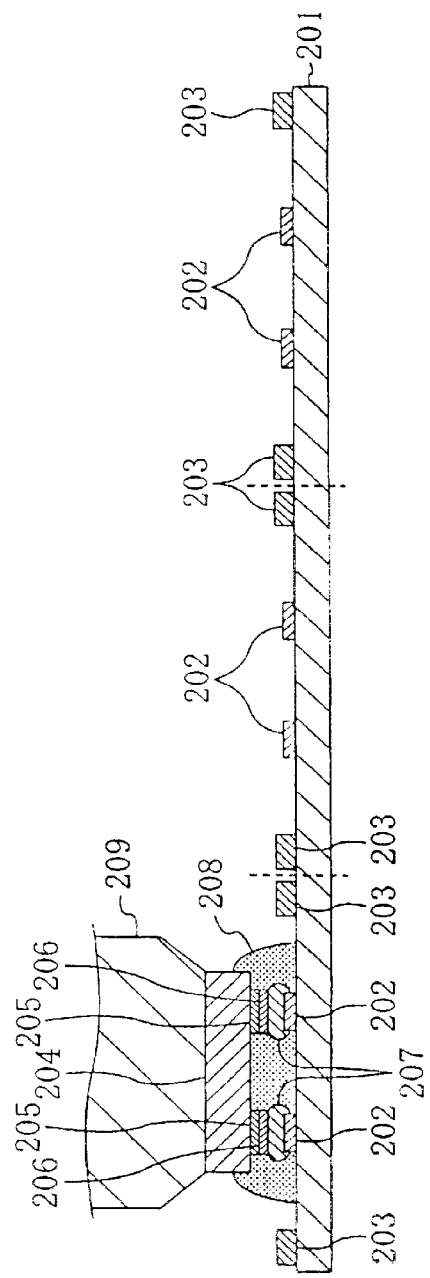
FIG. 11A
FIG. 11B

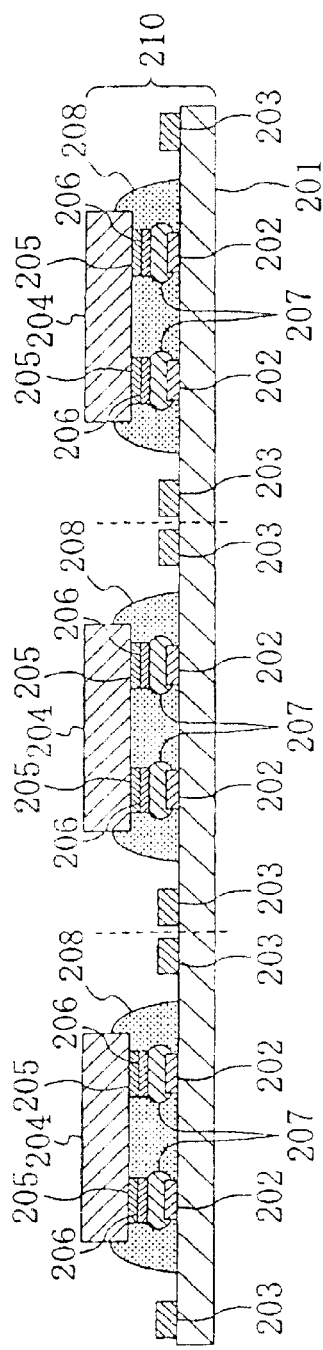
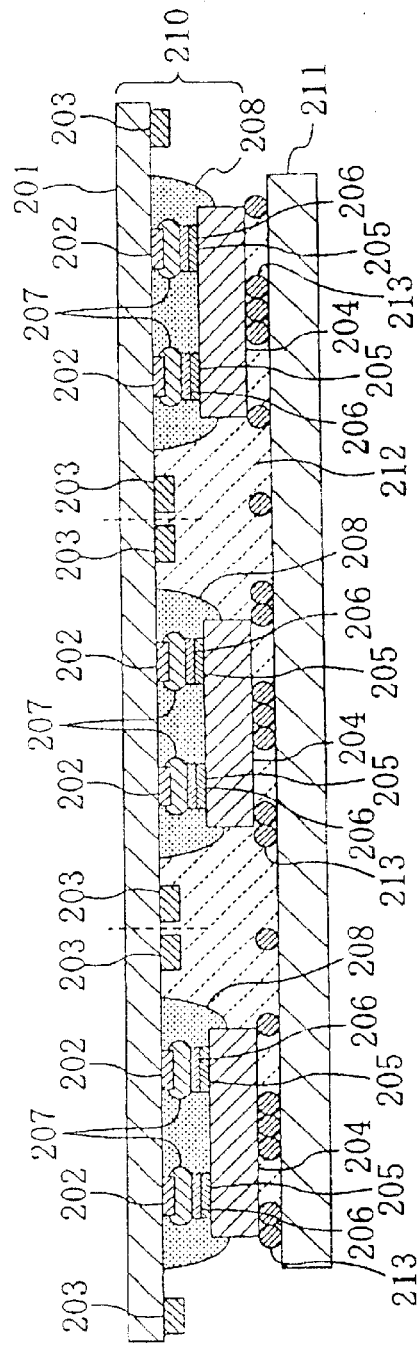
FIG. 12A
FIG. 12B

SEMICONDUCTOR DEVICE AND MANUFACTURING METHOD THEREOF

This application is a divisional of Ser. No. 10/062,535 filed Feb. 5, 2002 now abandoned.

BACKGROUND OF THE INVENTION

The present invention relates to semiconductor devices having multiple semiconductor chips layered on one another and manufacturing methods thereof. The invention more particularly relates to a semiconductor device including two semiconductor chips having their circuit forming surfaces opposed to one another, and electrodes formed on the circuit forming surfaces being electrically connected with one another, and a manufacturing method thereof.

In recent years, with the advent of smaller size electronic devices capable of high speed processing, a three-dimensional structure including two or more kinds of semiconductor chips layered on one another has come to be widely researched and developed.

Such a conventional three-dimensional semiconductor device will be now described.

FIG. 18 is a sectional view of the conventional semiconductor device.

As shown in FIG. 18, the conventional semiconductor device includes a first semiconductor chip 1 and a second semiconductor chip 4. The first semiconductor chip 1 has first electrodes 2 and bonding pads 3 on a first main surface. The second semiconductor chip 4 is provided with second electrodes 5 on a second main surface and has a smaller area than the first semiconductor chip 1. Herein, the first and second semiconductor chips 1 and 4 are integrated so that their main surfaces (i.e., the circuit forming surfaces) are opposed to one another and the first and second electrodes 2 and 5 are electrically connected with one another. Stated differently, while the first and second electrodes 2 and 5 are registered, the second semiconductor chip 4 is placed face-down on the first semiconductor chip 1. More specifically, the first and second electrodes 2 and 5 are connected through a metal bump 7, while the part of the second electrode 5 in contact with the metal bump 7 is provided with a barrier metal layer 6. The bonding pads 3 are provided outside the region of the first main surface of the first semiconductor chip 1 opposed to the second main surface of the second semiconductor chip 4. There is a resin layer 8 filled between the first main surface of the first semiconductor chip 1 and the second main surface of the second semiconductor chip 4. More specifically, the first and second semiconductor chips 1 and 4 are adhered by the resin layer 8 into an integrated form.

The surface of the first semiconductor chip 1 opposite to the first main surface is secured to a die pad portion 9a by conductive paste 10 containing palladium (Pd), silver (Ag) or the like. The bonding pad 3, and a lead portion 9b provided adjacent to the die pad portion 9a are electrically connected with one another through a thin metal bonding wire 11. Note that the die pad portion 9a and the lead portion 9b are cut from a single lead frame 9. The first and second semiconductor chips 1 and 4, the die pad portion 9a, the lead portions 9b and the bonding wires 11 are encapsulated in a resin package 12.

A method of manufacturing the conventional semiconductor device will be now described.

FIGS. 19A, 19B, 20A and 20B are sectional views showing steps in the method of manufacturing the conventional semiconductor device.

As shown in FIG. 19A, the first and second semiconductor chips 1 and 4 are registered. More specifically, a plurality of first electrodes 2 and a plurality of bonding pads 3 are provided on a first main surface of the first semiconductor chip 1. The chip 1 is then placed on a packaging jig (not shown) and a resin 8A is applied on the first main surface of the semiconductor chip 1. The second semiconductor chip 4 having a plurality of second electrodes 5 on a second main surface is prepared over the first semiconductor chip 1 so that their main surfaces, i.e., their circuit forming surfaces are opposed to one another. Then, after a plurality of metal bumps 7 are formed on the second electrodes 5, the first and second electrodes 2 and 5 are registered. Note that there is a barrier metal layer 6 provided on the part of the second electrodes 5 in contact with the metal bumps 7.

Then, as shown in FIG. 19B, the first and second semiconductor chips 1 and 4 are joined with one another. More specifically, the second semiconductor chip 4 is heated and pressed using a metal tool 13 from the surface opposite to the second main surface. As a result, the first electrodes 2 on the first semiconductor chip 1 and the second electrodes 5 on the second semiconductor chip 4 are joined with one another through the metal bumps 7 formed on the second electrodes 5 (more precisely on the barrier metal layers 6) on the second semiconductor chip 4. Then, the resin 8A filled between the joined first and second semiconductor chips 1 and 4 is irradiated with ultraviolet rays or heated for curing and a resin layer 8 results.

Then, as shown in FIG. 20A, the joined first and second semiconductor chips 1 and 4 in an integrated form (hereinafter referred to as a "chip-layered body") is subjected to wire-bonding. More specifically, a lead frame 9 having a die pad portion 9a and lead portions 9b is prepared. Then, the surface opposite to the first main surface of the first semiconductor chip 1 is secured onto the die pad portion 9a using conductive paste 10 containing Pd, Ag or the like. The bonding pads 3 on the first semiconductor chip 1 and the lead portions 9b are then electrically connected through thin metal bonding wires 11. Thus, the electrical connection for the semiconductor device is completed.

As shown in FIG. 20B, the chip-layered body after the wire-bonding step is encapsulated in a resin. More specifically, the first and second semiconductor chips 1 and 4, the die pad portion 9a, the lead portions 9b and the bonding wires 11 are encapsulated in a resin package 12. Note however that the bottom surface of the die pad portion 9a and the bottom and outer side surfaces of the lead portions 9b (the side surfaces opposite to the side facing the die pad portion 9a) are exposed out of the resin package 12. Thus, the bottom and outer side surfaces of the lead portions 9b serve as external terminals.

However, the conventional semiconductor device and the manufacturing method thereof described above suffer from the following disadvantages. The thickness of the semiconductor device having multiple layers of semiconductor chips increases in proportion to the number of the semiconductor chips used. For example, in the conventional semiconductor device shown in FIG. 18, the thickness of the first and second semiconductor chips 1 and 4 is each about in the range from 200 to 300 μm even after the back surface (the surface opposite to the circuit forming surface (main surface)) is polished. The metal bumps 7 used to join the first and second semiconductor chips 1 and 4 are about as thick as several tens μm after the joining. In addition, if the chip-layered body including the first and second semiconductor chips 1 and 4 is die-bonded to the die pad portion 9a as thick as several hundreds μm and the die-bonded chip-layered body as a whole is encapsulated in the resin package 12, the completed semiconductor device has a thickness about as large as 1 mm. Such a thickness is about the same as the thickness of the thin type packages widely used in recent years, which suggests how hard it could be to reduce the size of semiconductor devices having such a chip-layered body.

Meanwhile, semiconductor chips with large thickness in a semiconductor device could impede thermal radiation from the semiconductor chips, and therefore the heat radiation property of the semiconductor device as a whole could be lowered.

SUMMARY OF THE INVENTION

In view of the foregoing, it is an object of the present invention to reduce the thickness of a chip-layered body forming a semiconductor device, and allow the semiconductor device to have a reduced size and improved heat radiation property.

In order to achieve the object, the semiconductor device according to the present invention includes a first semiconductor chip provided with a first electrode on a first main surface, and a second semiconductor chip provided with a second electrode on a second main surface. The first and second semiconductor chips are integrated with one another so that the first and second main surfaces are opposed to one another and the first and second electrodes are electrically connected. The second semiconductor chip has a thickness smaller than a thickness of the first semiconductor chip.

In the semiconductor device according to the present invention, since the second semiconductor chip integrated facedown with the first semiconductor chip has a thickness smaller than that of the first semiconductor chip, a chip-layered body including the first and second semiconductor chips may have a reduced thickness. The package structure including the chip-layered body encapsulated in a resin can thus be thinner, which allows the semiconductor device to have a reduced size and improved heat radiation property.

In the semiconductor device according to the present invention, the second semiconductor chip preferably has the thickness equal to or smaller than ½ of the thickness of the first semiconductor chip.

In this way, the package structure for the chip-layered body can be made thinner, so that the semiconductor device can have a more reduced size and higher heat radiation property.

In the semiconductor device according to the present invention, a resin layer is preferably provided between the first and second main surfaces. Alternatively, a resin package to encapsulate the first and second semiconductor chips is preferably provided.

In this way, the chip-layered body including the first and second semiconductor chips can have improved reliability.

In the semiconductor device according to the present invention, an area of the first main surface is larger than an area of the second main surface, and a third electrode is provided outside a region of the first main surface opposed to the second main surface. A surface opposite to the first main surface of the first semiconductor chip is adhered to a die pad, a lead is provided adjacent to the die pad, and the lead and the third electrode are connected through a bonding wire. The first semiconductor chip, the second semiconductor chip and the bonding wire may be encapsulated in a resin package. In this case, a distance from the first main surface to a surface opposite to the second main surface of the second semiconductor chip is preferably smaller than a distance from the first main surface to the highest position of the bonding wire on the first main surface. In this way, a semiconductor device including a chip-layered body of the first and second semiconductor chips placed on a lead frame can surely have a reduced size and improved heat radiation property.

A semiconductor device manufactured by a first manufacturing method according to the present invention includes a first semiconductor chip provided with a first electrode on a first main surface and a second semiconductor chip provided with a second electrode on a second main surface. The method includes a first step of integrating the first and second semiconductor chips by arranging the first and second main surfaces to be opposed to one another and electrically connecting the first and second electrodes, and a second step of polishing the second semiconductor chip integrated with the first semiconductor chip from the opposite side of the second main surface, so that the thickness of the second semiconductor chip is made smaller than the thickness of the first semiconductor chip.

According to the first method, after the first and second semiconductor chips are integrated to be opposed to one another, the second semiconductor chip is polished from the opposite side of the main surface (circuit forming surface), so that the second semiconductor chip has a thickness smaller than the thickness of the first semiconductor chip. Therefore, the thickness of the chip-layered body including the first and second semiconductor chips can be reduced, so that the package structure including the chip-layered body encapsulated in a resin can have a reduced thickness, which permits the semiconductor device to have a reduced size and improved heat radiation property.

By the first method, the first step preferably includes the step of forming a resin layer between the first and second main surfaces.

In this way, the chip-layered body including the first and second semiconductor chips may have improved reliability.

By the first method, the second step preferably includes the step of reducing the thickness of the second semiconductor chip to at most ½ of the thickness of the first semiconductor chip.

In this way, the package structure including the chip-layered body can have a more reduced thickness, so that the semiconductor device can have a more reduced size and higher heat radiation property.

By the first method, an area of the first main surface is larger than an area of the second main surface, a third electrode is provided outside a region of the first main surface opposed to the second main surface. The second step may precede the steps of adhering a surface of the first semiconductor chip opposite to the first main surface to a die pad, arranging a lead adjacent to the die pad and electrically connecting the lead and the third electrode through a bonding wire, and forming a resin package to encapsulate the first semiconductor chip, the second semiconductor chip and the bonding wire. In this case, the second step preferably includes the step of allowing a distance from the first main surface to a surface of the second semiconductor chip opposite to the second main surface to be smaller than a distance from the first main surface to the highest position of the bonding wire on the first main surface. In this way, the semiconductor device provided with the chip-layered body including the first and second semiconductor chips placed on a lead frame can surely have a reduced size and improved heat radiation property.

A semiconductor device manufactured by a second manufacturing method according to the present invention includes a first semiconductor chip provided with a first electrode on a first main surface and a second semiconductor chip provided with a second electrode on a second main surface. The method includes a first step of integrating a semiconductor wafer to be a plurality of the first semiconductor chips and a plurality of discrete second semiconductor chips by arranging the first main surface of each first semiconductor chip in the semiconductor wafer to be opposed to the second main surface of each second semiconductor chip and electrically connecting the first electrode on each first semiconductor chip in the semiconductor wafer and the second electrode on each second semiconductor chip, a second step of polishing the second semiconductor chip integrated with the semiconductor wafer from an opposite side of the second main surface so that a thickness of each second semiconductor chip is smaller than a thickness of the semiconductor wafer, and a third step of separating the semiconductor wafer integrated with the second semiconductor chips into a plurality of discrete first semiconductor chips, thereby forming a plurality of chip-layered bodies each including a discrete first semiconductor chips and a discrete the second semiconductor chips integrated with one another.

By the second method, in addition to the effects brought about by the first method, the following effect results. More specifically, a plurality of chip-layered bodies, in other words a plurality of semiconductor devices having a reduced size and improved heat radiation property can readily be manufactured simply by separating a semiconductor wafer into a plurality of discrete first semiconductor chips.

By the second method, the first step preferably includes the step of forming a resin layer between the first main surface of each first semiconductor chip in the semiconductor wafer and the second main surface of each second semiconductor chip.

In this way, the chip-layered body including the first and second semiconductor chips can have improved reliability.

By the second method, the second step preferably includes the step of reducing the thickness of each second semiconductor chip to at most ½ of the semiconductor wafer.

In this way, the package structure including the chip-layered body can have a more reduced thickness, so that the semiconductor device can have a more reduced size and improved heat radiation property.

By the second method, an area of the first main surface is larger than an area of the second main surface. A third electrode is provided outside a region of the first main surface opposed to the second main surface. After the third step, the chip-layered bodies may each be subjected to the steps of adhering a surface of the first semiconductor chip opposite to the first main surface to a die pad, providing a lead adjacent to the die pad and electrically connecting the lead and the third electrode through a bonding wire, and forming a resin package to encapsulate the first semiconductor chip, the second semiconductor chip and the bonding wire. In this case, the second step preferably includes the step of arranging a distance from the first main surface of each first semiconductor chip in the semiconductor wafer to a surface of each second semiconductor chip opposite to the second main surface to be smaller than a distance from the first main surface of each first semiconductor chip in the semiconductor wafer to the highest position of the bonding wire on the first main surface. In this way, the semiconductor device including the chip-layered body of the first and second semiconductor chips placed on a lead frame can surely have a reduced size and improved heat radiation property.

BRIEF DESCRIPTION OF THE DRAWINGS

FIGS. 4A and 4B are sectional views showing steps in a method of manufacturing a semiconductor device according to a third embodiment of the present invention;

FIGS. 6A and 6B are sectional views showing steps in the method of manufacturing a semiconductor device according to the third embodiment of the present invention;

FIG. 10 is a sectional view showing one step in the method of manufacturing a semiconductor device according to the modification of the third embodiment;

FIGS. 11A and 11B are sectional views showing steps in a method of manufacturing a semiconductor device according to a fourth embodiment of the present invention;

FIGS. 12A and 12B are sectional views showing steps in the method of manufacturing a semiconductor device according to the fourth embodiment of the present invention;

DETAILED DESCRIPTION OF THE INVENTION

[First Embodiment]

A semiconductor device according to a first embodiment of the present invention will be now described in conjunction with the accompanying drawings.

Figure 1:
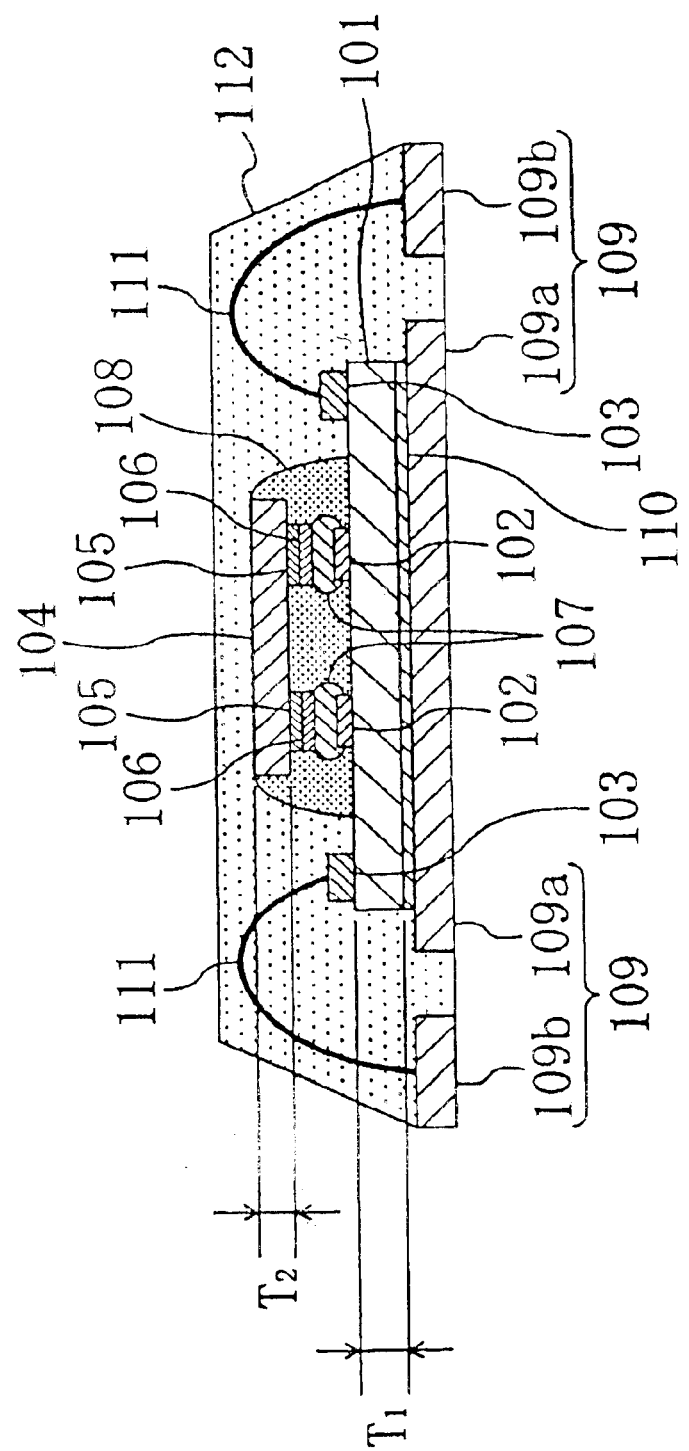
FIG. 1 is a sectional view of a semiconductor device according to a first embodiment of the present invention.

FIG. 1 is a sectional view of the semiconductor device according to the first embodiment.

As shown in FIG. 1, the semiconductor device according to the first embodiment includes first and second semiconductor chips 101 and 104. The first semiconductor chip 101 is provided with first electrodes 102 and bonding pads 103 on a first main surface. The second semiconductor chip 104 is provided with second electrodes 105 on a second main surface and has a smaller area than the first semiconductor chip 101. Herein, the first and second semiconductor chips 101 and 104 are integrated so that their main surfaces (i.e., their circuit forming surfaces) are opposed to one another and the first and second electrodes 102 and 105 are electrically connected with one another. Stated differently, the first and second electrodes 102 and 105 are registered as the second semiconductor chip 104 is joined facedown on the first semiconductor chip 101. More specifically, the first and second electrodes 102 and 105 are connected with one another through metal bumps 107. The part of the second electrode 105 in contact with the metal bump 107 is provided with a barrier metal layer 106. Note that the bonding pad 103 (which corresponds to the third electrode in the section of "What is claimed is:") is provided outside the region of the first main surface of the first semiconductor chip 101 opposed to the second main surface of the second semiconductor chip 104. There is a resin layer 108 filled between the first main surface of the first semiconductor chip 101 and the second main surface of the second semiconductor chip 104. More specifically, the first semiconductor chip 101 and the second semiconductor chip 104 are adhered by the resin layer 108 into an integrated form.

The surface of the first semiconductor chip 101 opposite to the first main surface is adhered to a die pad portion 109a by conductive paste 110 containing Pd, Ag or the like. Lead portions 109b provided adjacent to the die pad portion 109a are used to exchange electrical signals between elements such as transistors in the semiconductor chips and external devices. The lead portions 109b and the bonding pads 103 on the first semiconductor chip 101 are electrically connected through thin metal bonding wires 111. Note that the die pad portion 109a and the lead portion 109b are cut from a single lead frame 109. The first semiconductor chip 101, the second semiconductor chip 104, the die pad 109a, the lead portions 109b, and the bonding wires 111 are encapsulated in a resin package 112.

Herein, according to the first embodiment, as shown in FIG. 1, the second semiconductor chip 104 has a thickness $T_2$ smaller than the thickness of $T_1$ of the first semiconductor chip 101 ($T_2 < T_1$).

According to the first embodiment, the second semiconductor chip 104 integrated facedown with the first semiconductor chip 101 is thinner than the first semiconductor chip 101. Therefore, the chip-layered body including the first and second semiconductor chips 101 and 104 may have a reduced thickness. This allows the package structure including the chip-layered body encapsulated in the resin package 112 to be thinner, so that the semiconductor device can have a reduced size and improved heat radiation property.

Also according to the first embodiment, the resin layer 108 is provided between the first main surface of the first semiconductor chip 101 and the second main surface of the second semiconductor chip 104, and these semiconductor chips 101 and 104 are encapsulated in the resin package 112. Therefore, the chip-layered body including the first and second semiconductor chips 101 and 104 can have improved reliability.

[Modification of First Embodiment]

A semiconductor device according to a modification of the first embodiment of the present invention will be now described in conjunction with the accompanying drawings.

Figure 2:
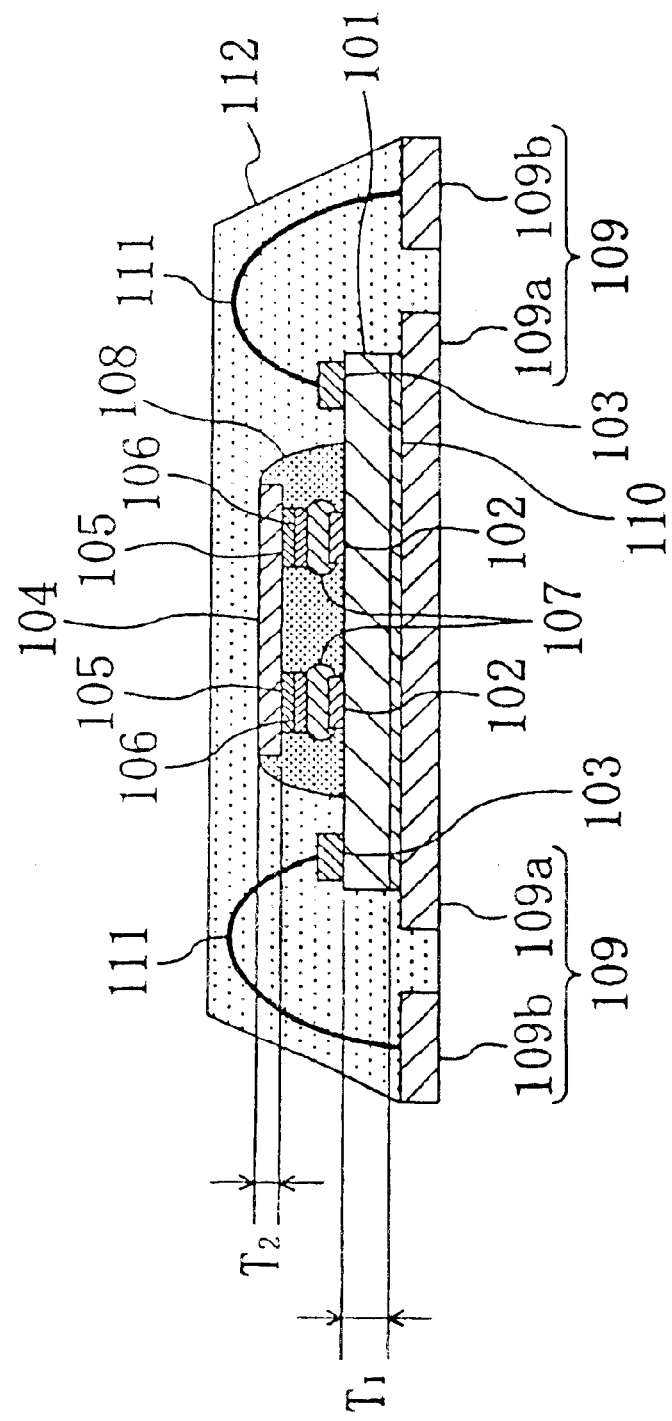
FIG. 2 is a sectional view of a semiconductor device according to a modification of the first embodiment.

FIG. 2 is a sectional view of the semiconductor device according to the modification of the first embodiment. Note that in the following description of the modification, the same elements as those in the first embodiment shown in FIG. 1 will be denoted by the same reference characters and will not be detailed.

As shown in FIG. 2, according to the modification of the first embodiment, the second semiconductor chip 104 has a thickness $T_2$ equal to or smaller than ½ of the thickness $T_1$ of the first semiconductor chip 101 ($T_2 \times 2 \leq T_1$).

According to the modification of the first embodiment, the package structure including the layered body of the first and second semiconductor chips 101 and 104 encapsulated in the resin package 112 can be made thinner than the first embodiment, and therefore the semiconductor device can have a more reduced size and more improved heat radiation property.

According to the modification of the first embodiment, the semiconductor chip 101 has, for example, a thickness $T_1$ about in the range from 200 to 300 μm, while the second semiconductor chip 104 has, for example, a thickness $T_2$ about in the range from 50 to 100 μm.

[Second Embodiment]

A semiconductor device according to a second embodiment of the present invention will be now described in conjunction with the accompanying drawings.

Figure 3:
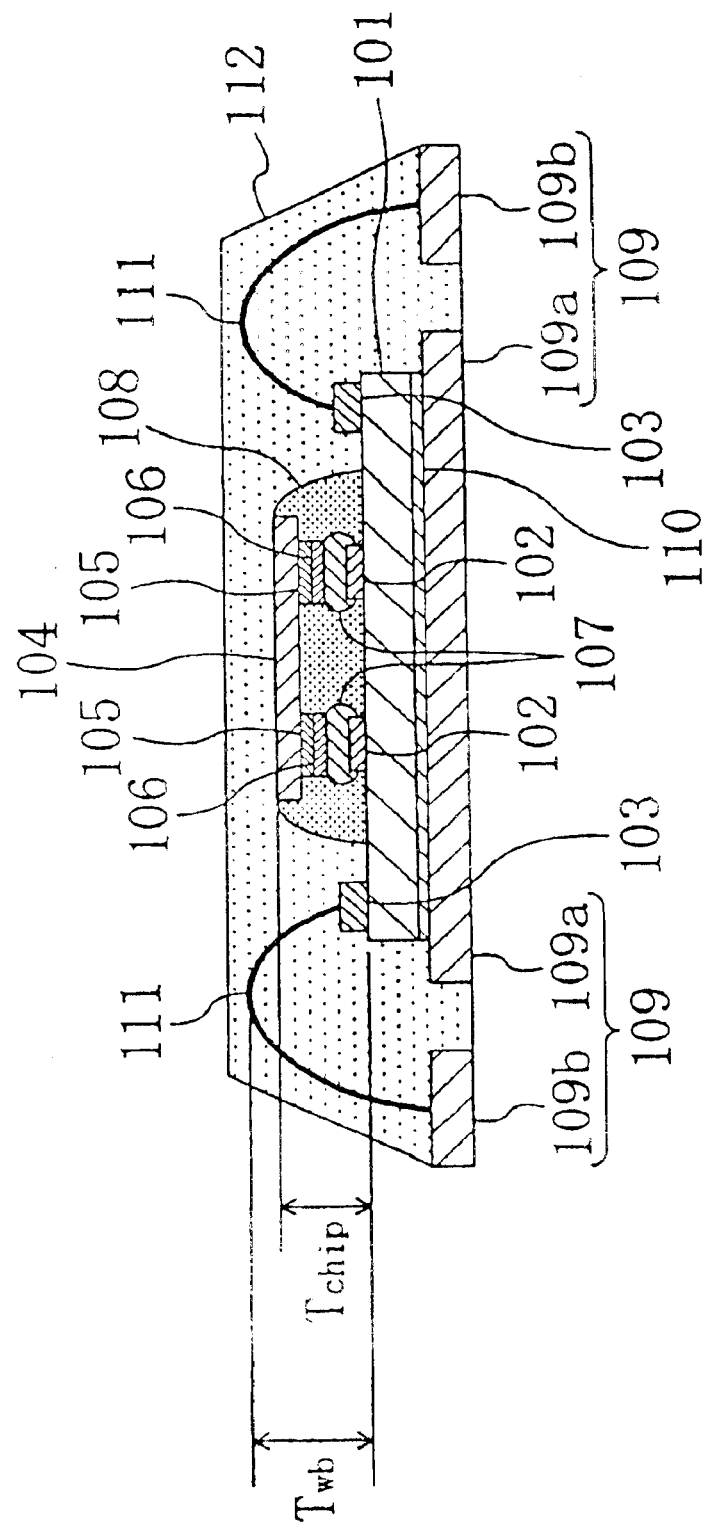
FIG. 3 is a sectional view of a semiconductor device according to a second embodiment of the present invention.

FIG. 3 is a sectional view of the semiconductor device according to the second embodiment. In the following description of the second embodiment, the same elements as those in the first embodiment shown in FIG. 1 will be denoted by the same reference characters and will not be detailed.

As shown in FIG. 3, according to the second embodiment, the distance $T_{chip}$ from the first main surface of the first semiconductor chip 101 to the surface of the second semiconductor chip 104 opposite to the second main surface is smaller than the distance $T_{wb}$ from the first main surface of the first semiconductor chip 101 to the highest position of the bonding wire 111 on the first main surface (i.e., the peak of the loop of the bonding wire 111)($T_{chip} < T_{wb}$).

According to the second embodiment, in addition to the effects brought about by the first embodiment, the following effect results. The semiconductor device including the layered body of the first semiconductor chip 101 and the second semiconductor chip 104 placed on the lead frame 109 can surely have a reduced size and improved heat radiation property.

[Third Embodiment]

A method of manufacturing a semiconductor device according to a third embodiment of the present invention will be now described in conjunction with the accompanying drawings.

FIGS. 4A, 4B, 5A, 5B, 6A, 6B, and 7 are sectional views showing steps in the method of manufacturing the semiconductor device according to the third embodiment.

As shown in FIG. 4A, a semiconductor wafer 201 having a plurality of chip regions to be first semiconductor chips 201a (see FIG. 6A) and a second semiconductor chip 204 are registered. The second semiconductor chip 204 has a smaller area than that of a chip region in the semiconductor wafer 201 (i.e., the first semiconductor chip 201a). Note that in FIGS. 4A, 4B, 5A, 5B, and 6A, the boundaries between the chip regions are denoted by broken lines.

Here, an element such as a transistor or interconnection is formed in each chip region in the semiconductor wafer 201. On the surface of each chip region in the semiconductor wafer 201 (i.e., on the first main surface of the semiconductor chip 201a), there are a plurality of first electrodes 202 (for connection with bumps) and a plurality of bonding pads 203 (for connection with thin metal wires). The first electrodes 202 and bonding pads 203 are formed, for example, of aluminum (Al). The bonding pad 203 corresponds to the "third electrode" in the section of "What is claimed is." Meanwhile, a plurality of second electrodes 205 of Al, for example, are formed on the second main surface of the semiconductor chip 204. A barrier metal layer 206 of a titanium, copper or nickel metal thin film, for example, is formed on each of the second electrodes 205.

More specifically, as shown in FIG. 4A, a metal bump 207 of an alloy of tin (Sn) and lead (Pb) (Sn—Pb alloy), for example, is formed on each of the second electrodes 205 on the second semiconductor chip 204 through the barrier metal layer 206. The metal bump 207 has a diameter about in the range from 3 to 100 $\mu$m and a height about in the range from 3 to 50 $\mu$m. The semiconductor wafer 201 is placed on the packaging jig (not shown) and a resin 208A such as an epoxy resin is applied on the surface of one chip region in the semiconductor wafer 201. Then, the second semiconductor chip 204 is held by a tool 209 over the chip region in the semiconductor wafer 201, so that the surface of the chip region and the second main surface of the semiconductor chip 204 are opposed to each other.

Then, as shown in FIG. 4B, the chip region in the semiconductor wafer 201 and the second semiconductor chip 204 are joined with each other. More specifically, the second semiconductor chip 204 is lowered as it is held by the tool 209, and the metal bumps 207 formed on the second electrodes 205 on the second semiconductor chip 204 and the first electrodes 202 placed in the chip region in the semiconductor wafer 201 are registered. Here, the bonding pads 203 in the chip region in the semiconductor wafer 201 are provided outside the region of the surface of the chip region opposed to the second main surface of the second semiconductor chip 204.

Then, the second semiconductor chip 204 is heated and pressed from the surface opposite to the second main surface using the tool 209. Thus, the registered first electrodes 202 and metal bumps 207 on the second semiconductor chip 204 are joined by physical or metallurgical effect (such as interdiffusion of atoms). At the time, the resin 208A applied on the surface of the chip region in the semiconductor wafer 201 enhances the adhesion between the semiconductor wafer 201 and the second semiconductor chip 204. Note that the pressing force (load) by the tool 209 should be about in the range from 0.98 to 196 mN for each metal bump 207, and the size of the load is set on the condition that the first electrodes 202 are not damaged. Alternatively, the load may be set on the condition that the characteristics of elements such as transistors or interconnections formed under the first electrodes 202 in the semiconductor wafer 201 are unaffected.

Then, the resin 208A is cured to form a resin layer 208, so that the second semiconductor chip 204 and the semiconductor wafer 201 are integrated. At the time, the resin 208A can be cured by irradiation of ultraviolet rays if it is a photosetting resin. The resin 208A can be cured by heating if it is a thermosetting resin. If the resin 208A is to be cured by heating (i.e., if the resin is a thermosetting resin), the resin 208A is heated using heating instrument such as an oven after it is released from the pressing by the tool 209. Alternatively, a heater installed in the tool 209 is used to directly heat the resin during the pressing step by the tool 209. Although the temperature varies depending on the kind of the resin, the resin 208A should be cured at a temperature about in the range from 70 to 300° C.

Figure 5A:
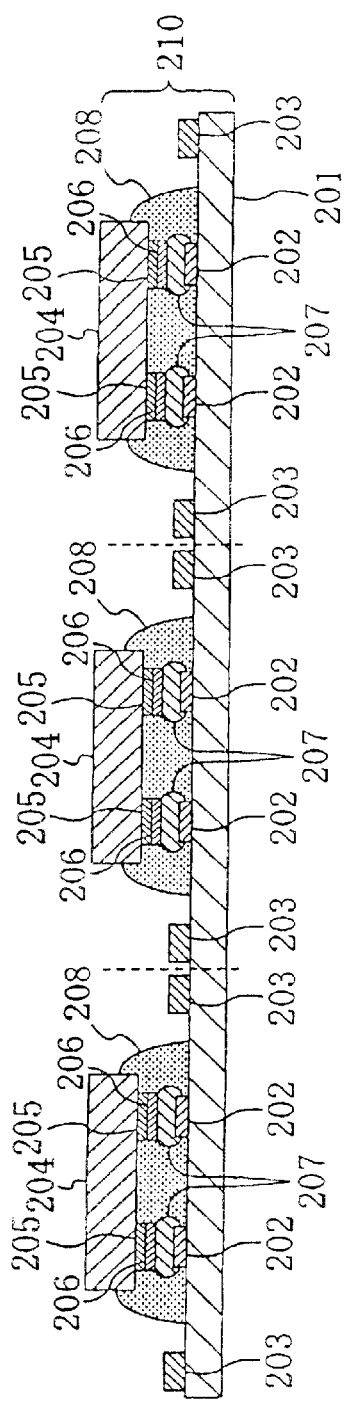
FIGS. 5A and 5B are sectional views showing steps in the method of manufacturing a semiconductor device according to the third embodiment of the present invention.

The steps shown in FIGS. 4A and 4B are repeated as many times as the number of chip regions provided in the semiconductor wafer 201. Then, as shown in FIG. 5A, a joined body 210 including a plurality of second semiconductor chips 204 each provided in a chip region in the semiconductor wafer 201 can be formed.

Figure 5B:
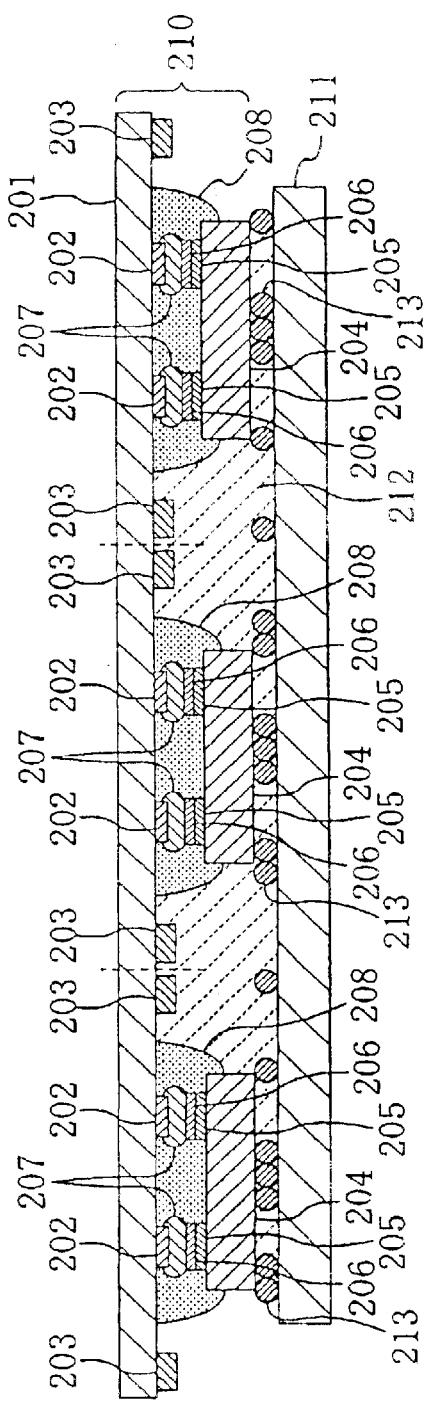

Then, as shown in FIG. 5B, the back surface of each of the semiconductor chips 204 (the surface opposite to the second main surface) in the joined body 210 is polished. More specifically, the resin 208A is sufficiently cured to form the resin layer 208, and then the joined body 210 is placed on a polishing machine 211 so that the back surfaces of the second semiconductor chips 204 placed in the chip regions in the semiconductor wafer 201 are opposed to the upper surface (polishing surface) of the polishing machine 211. A protection resin 212 is provided between the second semiconductor chips 204 placed in the chip regions in the semiconductor wafer 201. After the polishing surface of the polishing machine 211 is supplied with abrasive grains 213, the polishing machine 211 is rotated as the joined body 210 is loaded with weight. In this manner, the back surfaces of the second semiconductor chips 204 are polished. At the time, in the joined body 210 removed from the polishing machine 211, the thickness of the second semiconductor chip 204 on the semiconductor wafer 201 decreases in inverse proportion to the duration of the polishing time. Note that for the abrasive grains 213, diamond grains having a grain size in the range from #1200 to #2000 are preferably used, and the polishing machine 211 is preferably rotated at about 5 to 50 rpm.

According to the third embodiment, the back surfaces of the second semiconductor chips 204 can be polished so that the thickness of the second semiconductor chips 204 is at least smaller than the thickness of the semiconductor wafer 201 (i.e., the thickness of the first semiconductor chips 201a). More specifically, the polished second semiconductor chip 204 preferably has a thickness about in the range from 50 to 100 $\mu$m. Note that the semiconductor wafer 201 has a thickness about in the range from 200 to 300 $\mu$m, and the semiconductor chip 204 before polishing is about as thick as the semiconductor wafer 201.

Then, as shown in FIG. 6A, the semiconductor wafer 201 is subjected to dicing. More specifically, the chip regions in the semiconductor wafer 201 in the joined body 210 are separated as a plurality of discrete first semiconductor chips 201a by dicing. Thus, a plurality of chip-layered bodies 214 each including one first semiconductor chip 201a and one second semiconductor chip 204 joined with one another result. For the ease of illustration, only a single chip-layered body 214 will be described.

As shown in FIG. 6B, the chip-layered body 214 is subjected to die-bonding and wire-bonding. More specifically, a lead frame 215 having a die pad portion 215a and lead portions 215b is prepared. The back surface of the first semiconductor chip 201a forming the chip-layered body 214 (the surface opposite to the first main surface) is secured on the die pad portion 215a using conductive paste 216 containing Pd, Ag or the like. Then, the bonding pad 203 on the first semiconductor chip 201a and the lead portion 215b are electrically connected through a thin metal bonding wire 217. Here, the thin metal wire has a diameter of about 25 μm. Gold (Au), Al or the like can be used for the thin metal wire.

Figure 7:
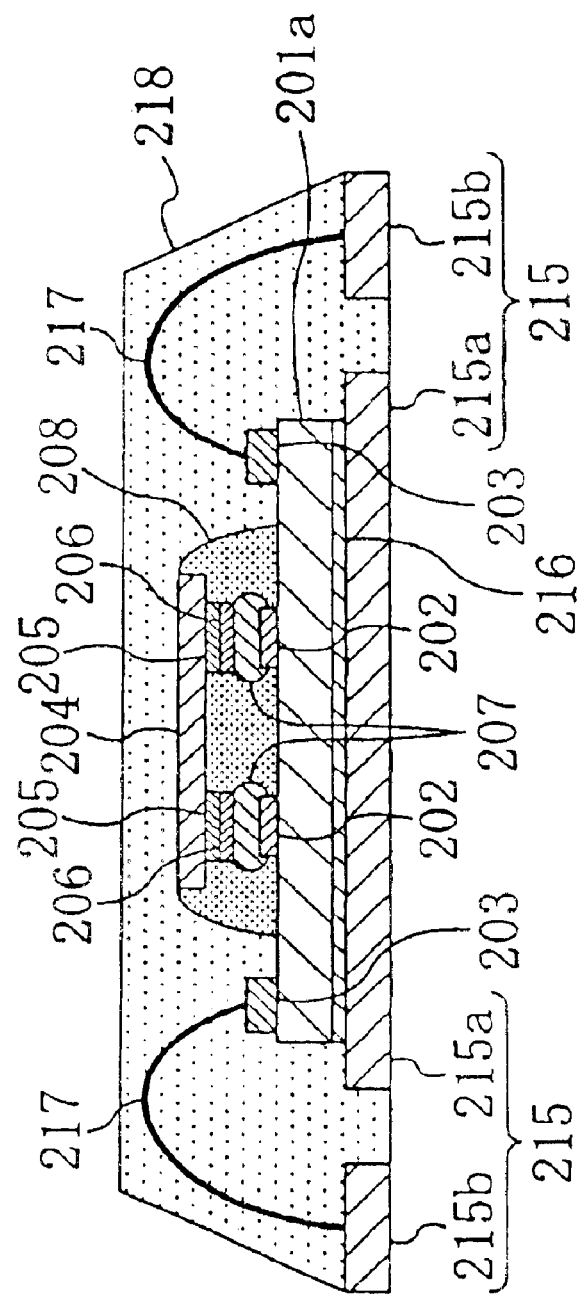
FIG. 7 is a sectional view showing one step in the method of manufacturing a semiconductor device according to the third embodiment.

As shown in FIG. 7, after the wire-bonding step, the chip-layered body 214 is encapsulated in a resin. More specifically, the first semiconductor chip 201a, the second semiconductor chip 204, the die pad portion 215a and lead portions 215b of the lead frame 215, and the bonding wires 217 are encapsulated in a resin package 218 of an epoxy-based resin, a polyimide-based resin or the like. Note, however, that the bottom surface of the die pad portion 215a and the bottom and outer side surfaces of the lead portions 215b are exposed out of the resin package 218. Thus, the bottom and outer side surfaces of the lead portions 215b serve as external terminals.

As in the foregoing, according to the third embodiment, the plurality of first semiconductor chips 201a in the semiconductor wafer 201 and the plurality of discrete second semiconductor chips 204 are integrated to face to one another. Then, the second semiconductor chips 204 are polished from the side opposite to their main surfaces (circuit forming surfaces), so that the second semiconductor chips 204 have a thickness smaller than the thickness of the semiconductor wafer 201 or the first semiconductor chip 201a. Then, the semiconductor wafer 201 is separated into a plurality of discrete first semiconductor chips 201a, so that a plurality of chip-layered bodies 214 each including a discrete first semiconductor chip 201a and a discrete second semiconductor chip 204 joined with one another are formed. Therefore, the chip-layered body 214 may have a reduced thickness, and the package structure including the chip-layered body 214 encapsulated in the resin package 218 can be made thinner. This permits the semiconductor device to have a reduced size and improved heat radiation property. A plurality of chip-layered bodies 214, in other words a plurality of semiconductor devices having a reduced size and improved heat radiation property can easily be produced simply by separating the semiconductor wafer 201 into a plurality of discrete semiconductor chips 201a.

Meanwhile, according to the third embodiment, the semiconductor wafer 201 to be separated into the plurality of semiconductor chips 201a is not polished for the purpose of reducing the thickness of the chip-layered body 214. This is because the area of the semiconductor wafer 201 is larger than the area of the second semiconductor chip 204, and if therefore the semiconductor wafer 201 is polished, mechanical defects such as cracking or chipping are likely to result. In contrast, the second semiconductor chips 204 are prepared as they are separated as discrete chips and have a smaller area, and therefore such mechanical defects are much less likely if the second semiconductor chips 204 are polished.

Note that according to the third embodiment, after the step of polishing the second semiconductor chip 204 from the back surface (see FIG. 5B), the second semiconductor chip 204 preferably has a thickness about ½ or less of the thickness of the semiconductor wafer 201 (i.e., the thickness of the first semiconductor chip 201a). Thus, the package structure including the chip-layered body 214 encapsulated in the resin package 218 can be made thinner, so that the semiconductor device can have a more reduced size and more improved heat radiation property.

According to the third embodiment, the Sn—Pb alloy is used as the material of the metal bumps 207, while one selected from Au, In, Cu, Ni, an In—Sn alloy, a Sn—Ag alloy, a Sn—Cu alloy and a Sn—Zn alloy may be used. For electrical connection between the first and second electrodes 202 and 205, a resin having a metallic filler dispersed therein may be used instead of the metal bumps 207.

According to the third embodiment, the metal bumps 207 are formed on the second electrodes 205 on the second semiconductor chip 204, while the metal bumps 207 may be formed on the first electrodes 202 provided in each chip region in the semiconductor wafer 201.

According to the third embodiment, the resin 208A is the epoxy resin, while an acrylic resin, a polyimide resin, a urethane resin or the like can be used. The resin 208A may be any of thermosetting resin, autopolymer resin, and photosetting resin. The resin 208A may be preferably applied according to any suitable method among dispensing, printing and stamping methods and the like in consideration of the chip size and other conditions.

According to the third embodiment, the resin 208A is applied on the surface of each chip region in the semiconductor wafer 201 (the first main surface of each first semiconductor chip 201a), while the resin 208A may be applied on the second main surface of the second semiconductor chip 204.

According to the third embodiment, the resin 208A is applied before joining the first electrodes 202 and the second electrodes 205 through the metal bumps 207. The resin 208A may be applied in a different timing such as after joining these electrodes through the metal bumps 207.

According to the third embodiment, the resin 208A or resin layer 208 is interposed between the surfaces of the chip regions in the semiconductor wafer 201 (i.e., the first main surfaces of the first semiconductor chips 201a) and the second main surfaces of the second semiconductor chips 204. Meanwhile, an anisotropic conductive sheet, an anisotropic conductive resin or the like may be interposed therebetween.

[Modification of Third Embodiment]

A method of manufacturing a semiconductor device according to a modification of the third embodiment of the invention will be now descried in conjunction with the accompanying drawings.

FIGS. 8A, 8B, 9A, 9B and 10 are sectional views showing steps in the method of manufacturing a semiconductor device according to the modification of the third embodiment. Note that according to the modification, the same elements as those in the third embodiment shown in FIGS. 4A, 4B, 5A, 5B, 6A, 6B and 7 will be denoted by the same reference characters and will not be described in some cases.

Unlike the third embodiment, according to the modification of the third embodiment, discrete first semiconductor chips 201a formed by dicing the semiconductor wafer are prepared and then the first and second semiconductor chips 201a and 204 are integrated.

Figure 8A:
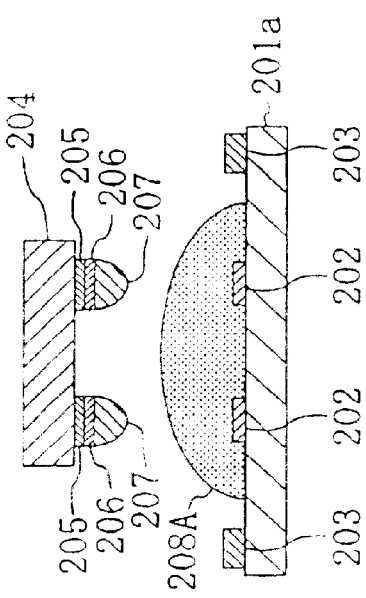
FIGS. 8A and 8B are sectional views showing steps in a method of manufacturing a semiconductor device according to a modification of the third embodiment of the present invention.

As shown in FIG. 8A, the first semiconductor chip 201a and the second semiconductor chip 204 having a smaller area than the first semiconductor chip 201a are registered. Note that there are a plurality of first electrodes 202 (for connection with bumps) of Al, for example, and a plurality of bonding pads 203 (for connection with thin metal wires) of Al, for example, on the first main surface of the first semiconductor chip 201a. Meanwhile, there are a plurality of second electrodes 205 of Al, for example, on the second main surface of the second semiconductor chip 204. The second electrodes 205 each have a barrier metal layer 206 thereon. The layer is of a metal thin film such as titanium, copper and nickel films.

More specifically, as shown in FIG. 8A, metal bumps 207 of a Sn—Pb alloy, for example, are formed on the second electrodes 205 on the second semiconductor chip 204 through the barrier metal layers 206. The metal bump 207 has, for example, a diameter about in the range from 3 to 100 µm, and a height about in the range from 3 to 50 µm. The first semiconductor chip 201a is placed on the packaging jig (not shown) and a resin 208A such as an epoxy resin is applied on the first main surface of the first semiconductor chip 201a. Then, the second semiconductor chip 204 is held over the first semiconductor chip 201a using the tool 209 so that the main surfaces of the semiconductor chips, i.e., the circuit forming surfaces are opposed to each other.

Figure 8B:
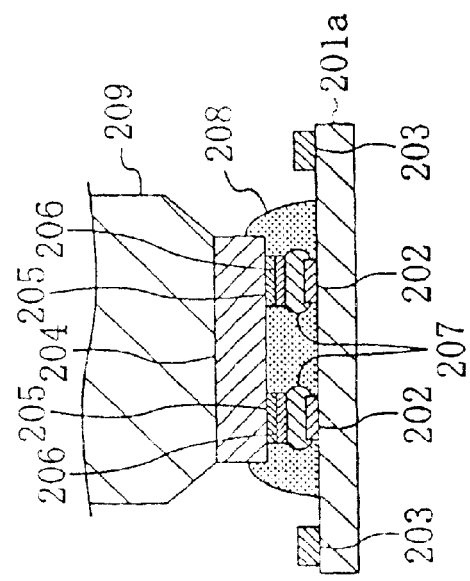

Then, as shown in FIG. 8B, the first semiconductor chip 201a and the second semiconductor chip 204 are joined with each other. More specifically, the second semiconductor chip 204 is lowered as it is held by the tool 209, and the metal bumps 207 formed on the second electrodes 205 on the second semiconductor chip 204 and the first electrodes 202 on the first semiconductor chip 201a are registered. Here, the bonding pads 203 on the first semiconductor chip 201a are provided outside the region of the first main surface of the first semiconductor chip 201a opposed to the second main surface of the second semiconductor chip 204. Then, the second semiconductor chip 204 is heated and pressed using the tool 209 from the surface opposite to the second main surface. Thus, the registered first electrodes 202 and metal bumps 207 on the second semiconductor chip 204 are joined. At the time, the resin 208A applied on the first main surface of the first semiconductor chip 201a enhances the adhesion between the first and second semiconductor chips 201a and 204. Note that the pressing force (load) applied by the tool 209 is suitably about in the range from 0.98 to 196 mN for each metal bump 207, and the load is set on the condition that the first electrodes 202 are not damaged. Alternatively, the load could be set on the condition that the characteristics of elements such as transistors, interconnections or the like formed under the first electrodes 202 on the first semiconductor chip 201a are unaffected. Then, the resin 208A is cured to form the resin layer 208, so that the second and first semiconductor chips 204 and 201a are integrated.

Figure 9A:
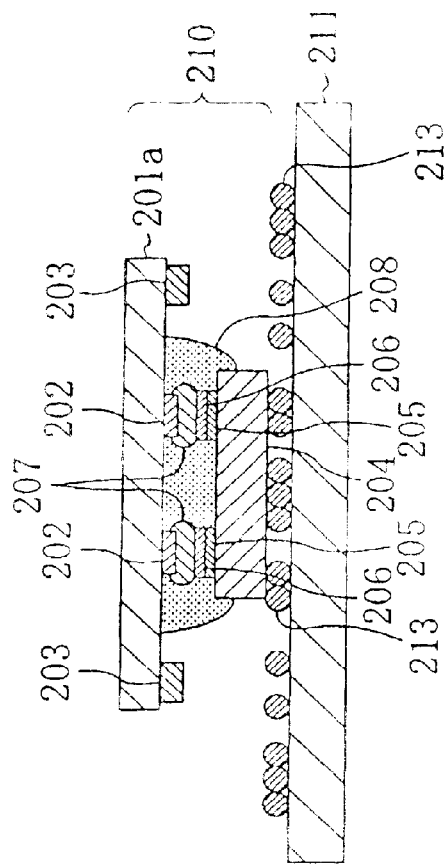
FIGS. 9A, and 9B are sectional views showing steps in the method of manufacturing a semiconductor device according to the modification of the third embodiment of the present invention.

Then, as shown in FIG. 9A, in the joined body 210 having the first semiconductor chip 201a and the second semiconductor chip 204 placed thereon, the back surface of the second semiconductor chip 204 (the surface opposite to the second main surface) is polished. More specifically, the resin 208A is sufficiently cured to form the resin layer 208 and then the joined body 210 is placed on the polishing machine 211 so that the back surface of the second semiconductor chip 204 is opposed to the upper surface (polishing surface) of the polishing machine 211. Abrasive grains 213 are supplied to the polishing surface of the polishing machine 211, and then the joined body 210 is loaded with weight as the polishing machine 211 is rotated to polish the back surface of the second semiconductor chip 204. At the time, in the joined body 210 removed from the polishing machine 211, the thickness of the second semiconductor chip 204 decreases in inverse proportion to the duration of the polishing time period. Note that for the abrasive grains 213, diamond grains having a grain size in the range from #1200 to #2000 are preferably used, and the polishing machine 211 is preferably rotated at about 5 to 50 rpm.

According to the modification of the third embodiment, the back surface of the second semiconductor chip 204 is polished so that the thickness of the second semiconductor chip 204 is at least smaller than that of the first semiconductor chip 201a. More specifically, the thickness of the polished semiconductor chip 204 preferably has a thickness about in the range from 50 to 100 µm. Note that the second semiconductor chip 204 before the polishing has a thickness about in the range from 200 to 300 µm which is about as large as the thickness of the first semiconductor chip 201a.

Figure 9B:
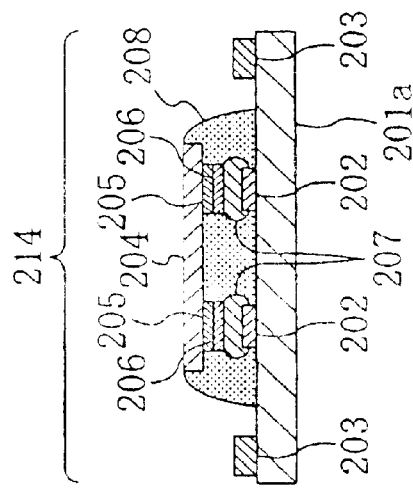

As shown in FIGS. 9B and 10, the chip-layered body 214 including the first semiconductor chip 201a and the second semiconductor chip 204 having a polished back surface joined with one another is subjected to die-bonding and wire-bonding, and resin encapsulation. More specifically, a lead frame 215 having a die pad portion 215a and lead portions 215b is prepared. The back surface of the first semiconductor chip 201a of the chip-layered body 214 (the surface opposite to the first main surface) is secured on the die pad portion 215a with conductive paste 216 containing Pd, Ag or the like. Then, the bonding pads 203 on the first semiconductor chip 201a and the lead portions 215b are electrically connected with one another through the thin metal bonding wires 217. The thin metal wires have a diameter of about 25 µm. The material of the thin metal wires can be for example Au or Al. Finally, the first semiconductor chip 201a, the second semiconductor chip 204, the die pad portion 215a and lead portions 215b of the lead frame 215 and the bonding wires 217 are encapsulated in a resin package 218 of an epoxy-based resin or a polyimide-based resin. Note, however, that the bottom surface of the die pad portion 215a and the bottom and outer side surfaces of the lead portions 215b are exposed out of the resin package 218, so that the bottom and outer side surfaces of the lead portions 215b can serve as external terminals.

As in the foregoing, according to the modification of the third embodiment, the first and second semiconductor chips 201a and 204 are integrated to face to one another, and then the second semiconductor chip 204 is polished from the opposite side to the main surface (i.e., the circuit forming surface) so that the second semiconductor chip 204 is made thinner than the first semiconductor chip 201a. Therefore, the layered-body (chip-layered body 214) including the first and second semiconductor chips 201a and 204 can have a reduced thickness. As a result, the package structure including the chip-layered body 214 encapsulated in the resin package 218 can be made thinner, which allows the semiconductor device to have a reduced size and improved heat radiation property.

According to the modification of the third embodiment, after the step of polishing the second semiconductor chip 204 from the back surface (see FIG. 9A), the thickness of the second semiconductor chip 204 is preferably reduced to ½ or less of the thickness of the first semiconductor chip 201a. Thus, the package structure including the chip-layered body 214 encapsulated in the resin package 218 can be made thinner, and therefore the semiconductor device can have a more reduced size and higher heat radiation property.

According to the modification of the third embodiment, the Sn—Pb alloy is used for the material of the metal bumps 207, while any one of Au, In, Cu, Ni, an In—Sn alloy, a Sn—Ag alloy, a Sn—Cu alloy, and a Sn—Zn alloy may be used. As the material for electrical connection between the first and second electrodes 202 and 205, conductive paste, an anisotropic conductive resin or a resin having a metallic filler dispersed therein may be used instead of the metal bumps 207.

According to the modification of the third embodiment, the metal bumps 207 are formed on the second electrodes 205 on the second semiconductor chip 204, while the metal bumps 207 may be formed on the first electrodes 202 on the first semiconductor chip 201a.

According to the modification of the third embodiment, the resin 208A is the epoxy resin, while an acrylic resin, a polyimide resin, a urethane resin or like may be used. The resin 208A may be any of thermosetting resin, autopolymer resin and photosetting resin. The resin 208A is preferably applied by any suitable method among dispensing, printing and stamping methods and the like in consideration of the chip size and other conditions.

According to the modification of the third embodiment, the resin 208A is applied on the first main surface of the first semiconductor chip 201a, while the resin 208A may be applied on the second main surface of the second semiconductor chip 204.

According to the modification of the third embodiment, the resin 208A is applied before joining the first and second electrodes 202 and 205 through the metal bumps 207, while the resin 208A may be applied in a different timing such as after joining these electrodes through the metal bumps 207.

According to the modification of the third embodiment, the resin 208A or resin layer 208 is interposed between the first main surface of the first semiconductor chip 201a and the second main surface of the second semiconductor chip 204, while an anisotropic conductive sheet or an anisotropic conductive resin may be interposed.

[Fourth Embodiment]

A method of manufacturing a semiconductor device according to a fourth embodiment of the present invention will be now described.

FIGS. 11A, 11B, 12A, 12B, 13A, 13B and 14 are sectional views showing steps in the method of manufacturing a semiconductor device according to the fourth embodiment.

As shown in FIG. 11A, similarly to the step shown in FIG. 4A according to the third embodiment, a semiconductor wafer 201 and a second semiconductor chip 204 are registered. The wafer 201 has a plurality of chip regions to be a plurality of semiconductor chips 201a (see FIG. 13A). The second semiconductor chip 204 has a smaller area than a chip region (i.e., the first semiconductor chip 201a). Note that FIGS. 11A, 11B, 12A, 12B, and 13A show the boundaries between the chip regions by the dotted lines.

Here, elements such as transistors or interconnections are formed in the chip regions in the semiconductor wafer 201. A plurality of first electrodes 202 (for connection with bumps) of Al, for example, and a plurality of bonding pads 203 (for connection with thin metal wires) of Al, for example, are formed on the surface of each of the chip regions (i.e., the first main surface of the semiconductor chips 201a) in the semiconductor wafer 201. The bonding pad 203 corresponds to the "third electrode" in the section of "What is claimed is." Meanwhile, a plurality of second electrodes 205 of Al, for example, are provided on the second main surface of the second semiconductor chip 204. Barrier metal layers 206 of a thin metal film of titanium, copper, nickel or the like is provided on the second electrodes 205.

More specifically, as shown in FIG. 11A, metal bumps 207 of a Sn—Pb alloy, for example, are formed on the second electrodes 205 on the second semiconductor chip 204 through the barrier metal layers 206. The metal bump 207 has a diameter of about 3 to 100 $\mu$m and a height of about 3 to 50 $\mu$m. The semiconductor wafer 201 is placed on a packaging jig (not shown) and a resin 208A such as an epoxy resin is applied on the surface of one chip region in the semiconductor wafer 201. The second semiconductor chip 204 is held using the tool 209 over the chip region in the semiconductor wafer 201 so that the surface of the chip region and the second main surface of the second semiconductor chip 204 are opposed to each other.

As shown in FIG. 11B, similarly to the step shown in FIG. 4B according to the third embodiment, the chip region in the semiconductor wafer 201 and the second semiconductor chip 204 are joined with one another. More specifically, the second semiconductor chip 204 is lowered as it is held by the tool 209. Thus, the metal bumps 207 formed on the second electrodes 205 on the second semiconductor chip 204 and the first electrodes 202 provided in the chip region in the semiconductor wafer 201 are registered. Here, the bonding pads 203 in the chip region in the semiconductor wafer 201 are formed outside the region of the surface of the chip region opposed to the second main surface of the second semiconductor chip 204.

Then, the second semiconductor chip 204 is heated and pressed using the tool 209 from the surface opposite to the second main surface. As a result, the registered first electrodes 202 and the metal bumps 207 on the second semiconductor chip 204 are joined by physical or metallurgical effect. At the time, the resin 208A previously applied on the surface of the chip region in the semiconductor wafer 201 enhances the adhesion between the semiconductor wafer 201 and the second semiconductor chip 204. Note that the pressing force (load) by the tool 209 is suitably about in the range from 0.98 to 196 mN for each metal bump 207, and the load is set on the condition that the first electrodes 202 are not damaged. Alternatively, the load may be set on the condition that the characteristics of elements such as transistors or interconnections formed under the first electrodes 202 in the semiconductor wafer 201 are unaffected.

Then, the resin 208A is cured to form the resin layer 208, so that the second semiconductor chip 204 and the semiconductor wafer 201 are integrated. At the time, if the resin 208A which is a photosetting resin, it is cured by irradiation of ultraviolet rays. If the resin 208A is a thermosetting resin, it is cured by heating. In this case, the resin 208A is heated using heating instrument such as an oven after it is released from the pressing by the tool 209 or directly heated during the pressing step by the tool 209 using a heater installed in the tool 209. The resin is appropriately heated for curing at a temperature of about 70 to 300° C. though the temperature depends on the material of the resin 208A.

The steps shown in FIGS. 11A and 11B are repeated as many times as the number of chip regions provided in the semiconductor wafer 201, so that the joined body 210 as shown in FIG. 12(a) results. As shown, a plurality of second semiconductor chips 204 are provided in the chip regions in the semiconductor wafer 201.

As shown in FIG. 12B, similarly to the step shown in FIG. 5B according to the third embodiment, the back surface of the second semiconductor chip 204 (the surface opposite to the second main surface) in the joined body 210 is polished. More specifically, the resin 208A is sufficiently cured to form the resin layer 208. The joined body 210 is then placed on the polishing machine 211 so that the back surfaces of the second semiconductor chips 204 in the chip regions in the semiconductor wafer 201 are opposed to the upper surface (polishing surface) of the polishing machine 211. There is a protection resin 212 between the second semiconductor chips 204 placed in the chip regions in the semiconductor wafer 201.

According to the fourth embodiment, the protection resin 212 is a thermosetting liquid resin, and supplied between the second semiconductor chips 204 on the surface of the semiconductor wafer 201 by spraying, centrifugal spin coating, attaching resin taping or the like.

Abrasive grains 213 are supplied to the polishing surface of the polishing machine 211, and then the polishing machine 211 is rotated as the joined body 210 is loaded with weight, so that the back surfaces of the second semiconductor chips 204 are polished. At the time, in the joined body 210 removed from the polishing machine 211, the thickness of the second semiconductor chip 204 on the semiconductor wafer 201 decreases in inverse proportion to the duration of the polishing time. More specifically, the polished second semiconductor chip 204 may have a thickness about in the range from 50 to 100 μm. The semiconductor wafer 201 has a thickness about in the range from 200 to 300 μm (which is substantially equal to the thickness of the second semiconductor chip 204 before polishing). The thickness of the second semiconductor chip 204 is at least smaller than that of the semiconductor wafer 201 (i.e., the thickness of the first semiconductor chip 201a). Note that the abrasive grains 213 are preferably diamond grains having a grain size in the range from #1200 to #2000, and the polishing machine 211 is preferably rotated at about 5 to 50 rpm.

Figure 13A:
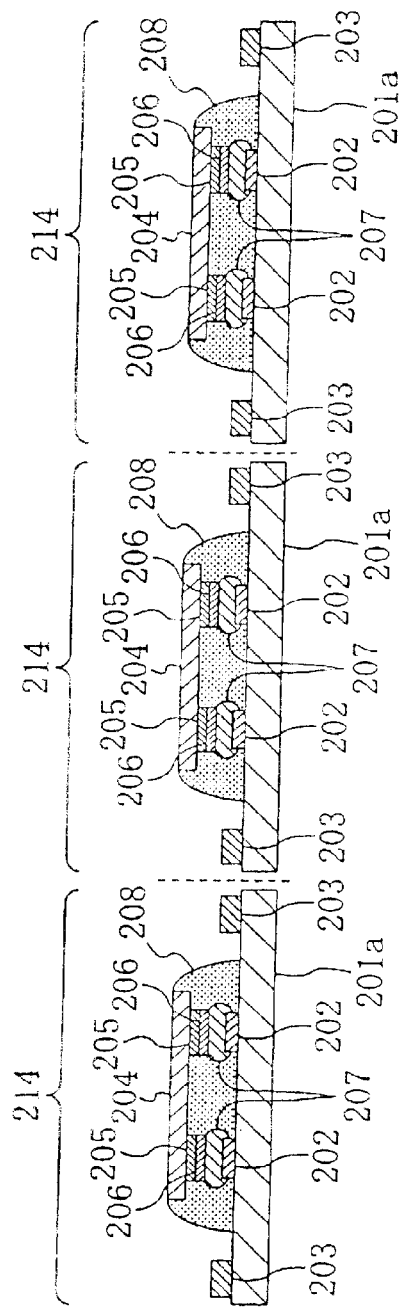
FIGS. 13A, and 13B are sectional views showing steps in the method of manufacturing a semiconductor device according to the fourth embodiment of the present invention.

As shown in FIG. 13A, similarly to the step shown in FIG. 6A according to the third embodiment, the semiconductor wafer 201 is separated by dicing. More specifically, the chip regions in the semiconductor wafer 201 in the joined body 210 are separated as a plurality of discrete first semiconductor chips 201a by dicing. Thus, a plurality of chip-layered bodies 214 each including one first semiconductor chip 201a and one second semiconductor chip 204 joined with each other result. For the ease of illustration, only a single chip-layered body 214 will be described.

Figure 13B:
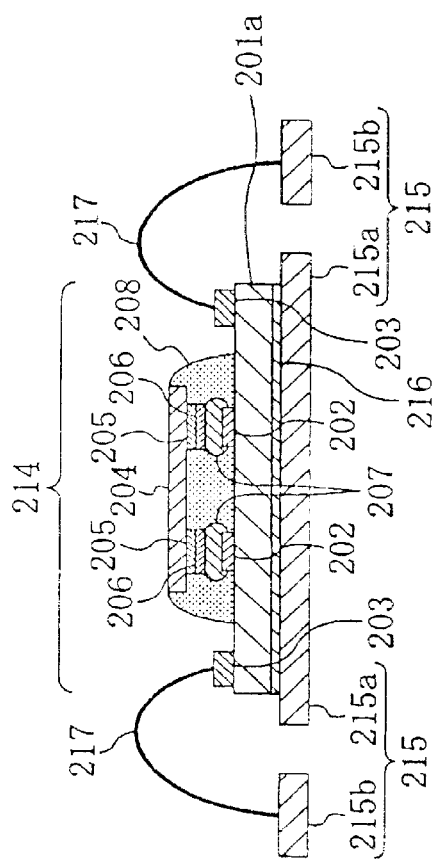

As shown in FIG. 13B, the chip-layered body 214 is subjected to die-bonding and wire-bonding. More specifically, a lead frame 215 having a die pad portion 215a and lead portions 215b is prepared, and the back surface of the first semiconductor chip 201a (the surface opposite to the first main surface) of the chip-layered body 214 is secured on the die pad portion 215a with conductive paste 216 containing Pd, Ag or the like. Then, the bonding pads 203 on the first semiconductor chip 201a and the lead portions 215b are electrically connected through thin metal bonding wires 217. Here, the thin metal wire has a diameter of about 25 μm. The material of the thin metal wire can be Au, Al or the like.

According to the fourth embodiment, as shown in FIG. 13B, the back surface of the second semiconductor chip 204 is polished so that the distance $T_{chip}$ from the first main surface of the first semiconductor chip 201a to the back surface of the second semiconductor chip 204 (the surface opposite to the second main surface) is smaller than the distance $T_{wb}$ from the first main surface of the first semiconductor chip 201a to the highest position of the bonding wire 217 on the first main surface (the peak of the loop of the bonding wire 217). More specifically, the distance $T_{chip}$ is about 100 to 150 μm and $T_{wb}$ is about 150 to 400 μm though they vary depending on the kind of the semiconductor device.

Figure 14:
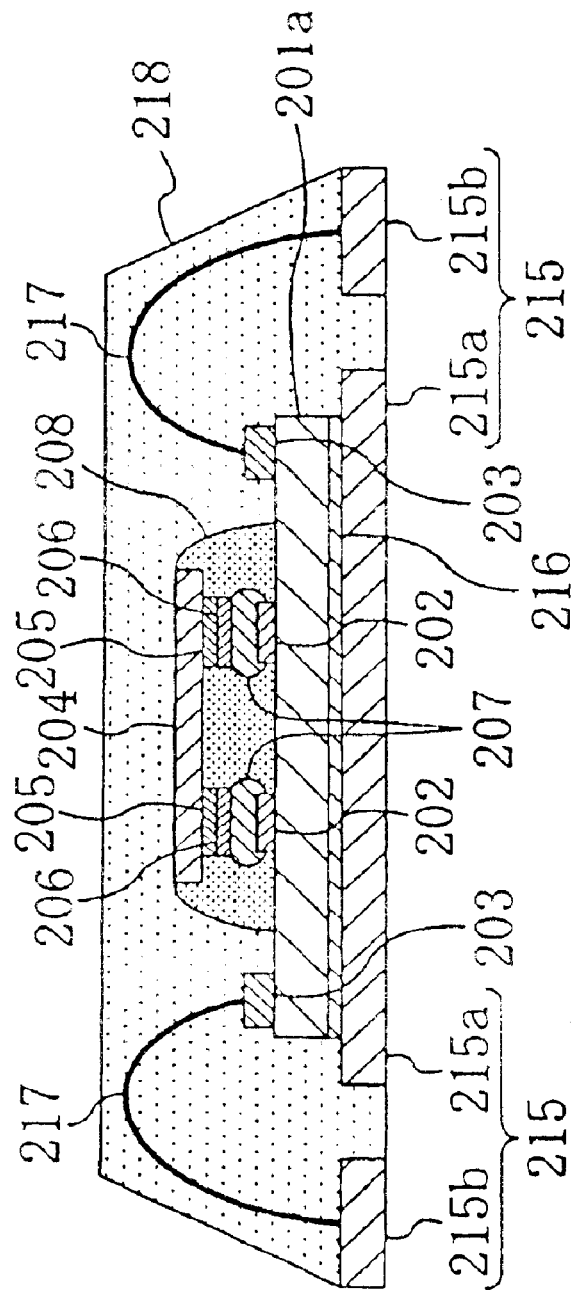
FIG. 14 is a sectional view showing one step in the method of manufacturing a semiconductor device according to the fourth embodiment.

Then, as shown in FIG. 14, similarly to the step shown in FIG. 7 according to the third embodiment, the chip-layered body 214 after the wire-bonding step is encapsulated in a resin. More specifically, the first semiconductor chip 201a, the second semiconductor chip 204, the die pad portion 215a and the lead portions 215b of the lead frame 215, and the bonding wires 217 are encapsulated in a resin package 218 of an epoxy-based resin, a polyimide-based resin or the like. Note however that the bottom surface of the die pad portion 215a and the bottom and outer side surfaces of the lead portions 215b are exposed out of the resin package 218. Thus, the bottom and outer side surfaces of the lead portions 215b can serve as external terminals.

As in the foregoing, according to the fourth embodiment, the plurality of first semiconductor chips 201a in the semiconductor wafer 201 and a plurality of discrete second semiconductor chips 204 are integrated to face to one another. Then, the semiconductor chips 204 are polished from the opposite side of their main surfaces (circuit forming surfaces). Therefore, the second semiconductor chips 204 have a thickness smaller than that of the semiconductor wafer 201, i.e., the thickness of the first semiconductor chips 201a. The semiconductor wafer 201 is then separated into a plurality of discrete semiconductor chips 201a, so that a plurality of chip-layered bodies 214 each including a discrete first semiconductor chip 201a and a discrete second semiconductor chip 204 joined with one another result. As a result, the chip-layered body 214 may have a reduced thickness so that the package structure including the chip-layered body 214 encapsulated in the resin package 218 can be thinner. As a result, the semiconductor device may have a reduced size and improved heat radiation property. Thus, the plurality of chip-layered bodies 214, in other words the plurality of semiconductor devices having a reduced size and improved heat radiation property can readily be manufactured simply by separating the semiconductor wafer 201 into the plurality of discrete first semiconductor chips 201a.

According to the fourth embodiment, the back surface of the second semiconductor chip 204 is polished so that the distance from the first main surface of the first semiconductor chip 201a to the back surface of the second semiconductor chip 204 is smaller than the distance from the first main surface of the first semiconductor chip 201a to the peak of the loop of the bonding wire 217. As a result, if the chip-layered body 214 is placed on the lead frame 215 in the semiconductor device, the device can surely have a reduced size and improved heat radiation property.

Note that according to the fourth embodiment, after the step of polishing the second semiconductor chip 204 from the back surface (see FIG. 12B), the second semiconductor chips 204 preferably have a thickness equal to or less than ½ of the thickness of the semiconductor wafer 201 (i.e., the first semiconductor chips 201a). In this way, the package structure including the chip-layered body 214 encapsulated in the resin package 218 can be made thinner. Therefore, the semiconductor device can have a more reduced size and more improved heat radiation property.

Also according to the fourth embodiment, the Sn—Pb alloy is used for the material of the metal bumps 207, while any one of Au, In, Cu, Ni, an In—Sn alloy, a Sn—Ag alloy, a Sn—Cu alloy, a Sn—Zn alloy and the like can be used. For the material used for electrical connection between the first electrodes 202 and the second electrodes 205, a resin having a metallic filler dispersed therein may be used instead of the metal bumps 207.

According to the fourth embodiment, the metal bumps 207 are formed on the second electrodes 205 on the second semiconductor chip 204, while the metal bumps 207 may be formed on the first electrodes 202 provided in the chip regions in the semiconductor wafer 201.

According to the fourth embodiment, the resin 208A is the epoxy resin, while an acrylic resin, a polyimide resin, a urethane resin or the like may be used. The resin 208A may be any of thermosetting resin, autopolymer resin, photosetting resin and the like. The resin 208A may preferably be applied by any suitable method among dispensing, printing, and stamping methods and the like in consideration of the chip size and other conditions.

According to the fourth embodiment, the resin 208A is applied on the surface of the chip region in the semiconductor wafer 201 (i.e., the first main surface of the first semiconductor chip 201a), while the resin 208A may be applied on the second main surface of the second semiconductor chip 204.

According to the fourth embodiment, the resin 208A is applied before joining the first and second electrodes 202 and 205 through the metal bumps 207, while the resin 208A may be applied in a different timing such as after joining the first and second electrodes 202 and 205 through the metal bumps 207.

According to the fourth embodiment, the resin 208A or resin layer 208 is interposed between the surface of each chip region in the semiconductor wafer 201 (i.e., the first main surface of each of the first semiconductor chips 201a) and the second main surface of each of the second semiconductor chips 204. Meanwhile, an anisotropic conductive sheet, an anisotropic conductive resin or the like may be interposed therebetween.

[Modification of Fourth Embodiment]

A method of manufacturing a semiconductor device according to a modification of the fourth embodiment of the present invention will be now described.

FIGS. 15A, 15B, 16A, 16B and 17 are sectional views showing steps in the method of manufacturing a semiconductor device according to the modification of the fourth embodiment. The same elements as those in the fourth embodiment shown in FIGS. 11A, 11B, 12A, 12B, 13A, 13B and 14 will be denoted by the same reference characters and will not be detailed in some cases.

Unlike the fourth embodiment, according to the modification of the fourth embodiment, discrete first semiconductor chips 201a formed by dicing a semiconductor wafer are prepared, and then the first and second semiconductor chips 201a and 204 are integrated.

Figure 15A:
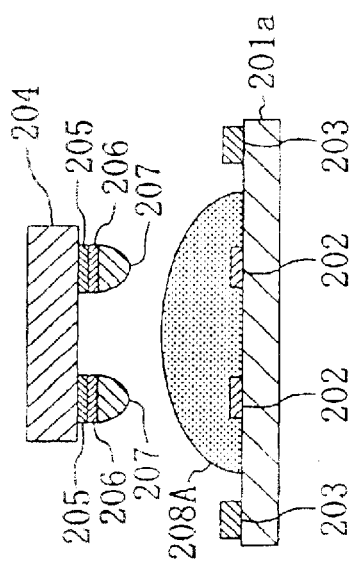
FIGS. 15A and 15B are sectional views showing steps in a method of manufacturing a semiconductor device according to a modification of the fourth embodiment of the present invention.

As shown in FIG. 15A, similarly to the step shown in FIG. 8A according to the modification of the third embodiment, the first semiconductor chip 201a and the second semiconductor chip 204 having a smaller area than the first semiconductor chip 201a are registered. Note that on the first main surface of the first semiconductor chip 201a, there are a plurality of first electrodes 202 of Al, for example, (for connection with bumps) and a plurality of bonding pads 203 of Al, for example (for connection with thin metal wires). Meanwhile, there are a plurality of second electrodes 205 of Al, for example, on the second main surface of the second semiconductor chip 204. There is a barrier metal layer 206 of a thin metal film such as titanium, copper and nickel films is formed on each of the second electrodes 205.

More specifically, as shown in FIG. 15A, metal bumps 207 of a Sn—Pb alloy, for example, are formed on the second electrodes 205 on the second semiconductor chip 204 through the barrier metal layers 206. The metal bumps 207 have, for example, a diameter about in the range from 3 to 100 $\mu$m and a height about in the range from 3 to 50 $\mu$m. The first semiconductor chip 201a is placed on a packaging jig (not shown) and a resin 208A such as an epoxy resin is applied on the first main surface of the first semiconductor chip 201a. Then, the second semiconductor chip 204 is held over the first semiconductor chip 201a using a tool 209 so that their main surfaces i.e., the circuit forming surfaces are opposed to one another.

Figure 15B:
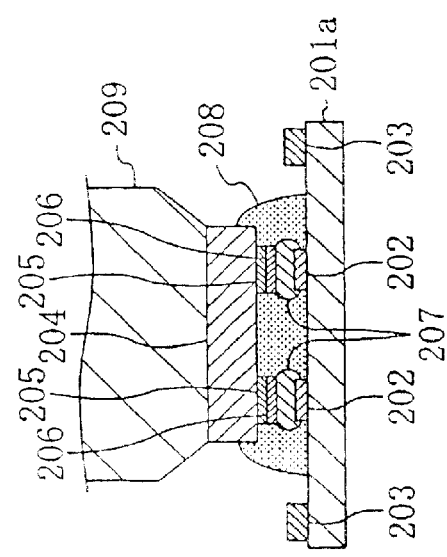

As shown in FIG. 15B, similarly to the step shown in FIG. 8B according to the modification of the third embodiment, the first and second semiconductor chips 201a and 204 are joined with one another. More specifically, the second semiconductor chip 204 is lowered as it is held by the tool 209. Then, the metal bumps 207 formed on the second electrodes 205 on the second semiconductor chip 204 and the first electrodes 202 on the first semiconductor chip 201a are registered. Here, the bonding pads 203 on the first semiconductor chip 201a are provided outside the region of the first main surface of the first semiconductor chip 201a opposed to the second main surface of the second semiconductor chip 204. Then, the second semiconductor chip 204 is heated and pressed using the tool 209 from the surface opposite to the second main surface. Thus, the registered first electrodes 202 and metal bumps 207 on the second semiconductor chip 204 are joined with one another. The resin 208A applied on the first main surface of the first semiconductor chip 201a enhances the adhesion between the first and second semiconductor chips 201a and 204. Note that the pressing force (load) by the tool 209 is suitably about 0.98 to 196 mN for each metal bump 207, while the load is set on the condition that the first electrodes 202 are not damaged. Alternatively, the load may be set on the condition that the characteristics of elements such as transistors and interconnections and the like formed under the first electrodes 202 are unaffected. Then, the resin 208A is cured to form a resin layer 208, so that the second semiconductor chip 204 and the first semiconductor chip 201a are integrated.

Figure 16A:
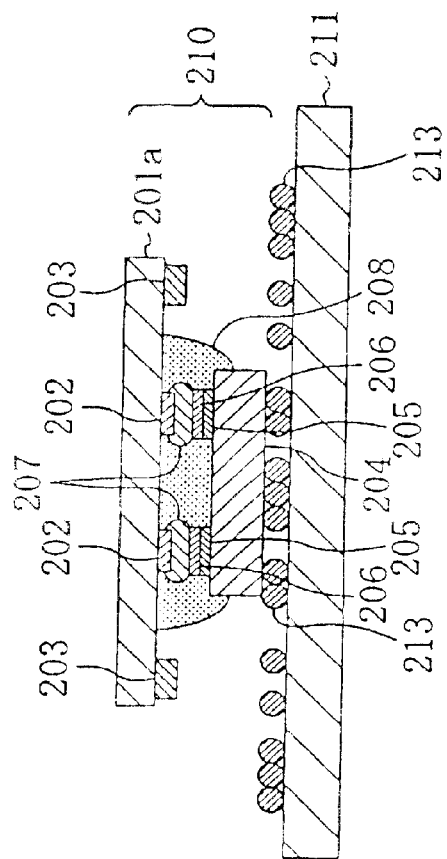
FIGS. 16A, and 16B are sectional views showing steps in the method of manufacturing a semiconductor device according to the modification of the fourth embodiment of the present invention.

As shown in FIG. 16A, similarly to the step shown in FIG. 9A according to the modification of the third embodiment, the back surface of the second semiconductor chip 204 (the surface opposite to the second main surface) in the joined body 210 having the second semiconductor chips 204 placed on the first semiconductor chip 201a is polished. More specifically, the resin 208A is sufficiently cured to form the resin layer 208, and then the joined body 210 is placed on a polishing machine 211 so that the back surface of the second semiconductor chip 204 is opposed to the upper surface (polishing surface) of the polishing machine 211. The polishing surface of the polishing machine 211 is supplied with abrasive grains 213, and then the polishing machine 211 is rotated as the joined body 210 is pressed, so that the back surface of the second semiconductor chip 204 is polished. At the time, in the joined body 210 removed from the polishing machine 211, the thickness of the second semiconductor chip 204 decreases in inverse proportion to the duration of the polishing time. More specifically, the polished second semiconductor chip 204 can have a thickness about in the range from 50 to 100 $\mu$m. The first semiconductor chip 201a has a thickness of about 200 to 300 $\mu$m (which is substantially equal to the thickness of the second semiconductor chip 204 before the polishing step). Therefore, the second semiconductor chip 204 has a thickness at least smaller than the thickness of the first semiconductor chip 201a. Note that the abrasive grains 213 may preferably be diamond grains having a grain size in the range from #1200 to #2000, and the polishing machine 211 is preferably rotated at about 5 to 50 rpm.

Figure 16B:
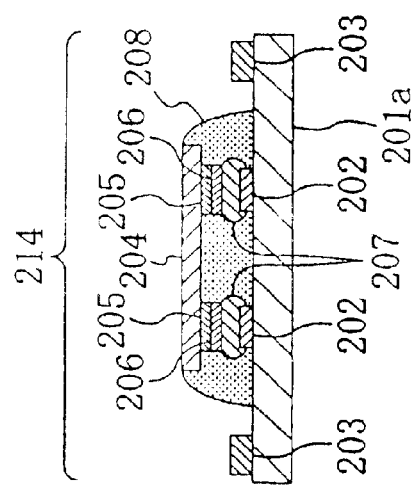
Figure 17:
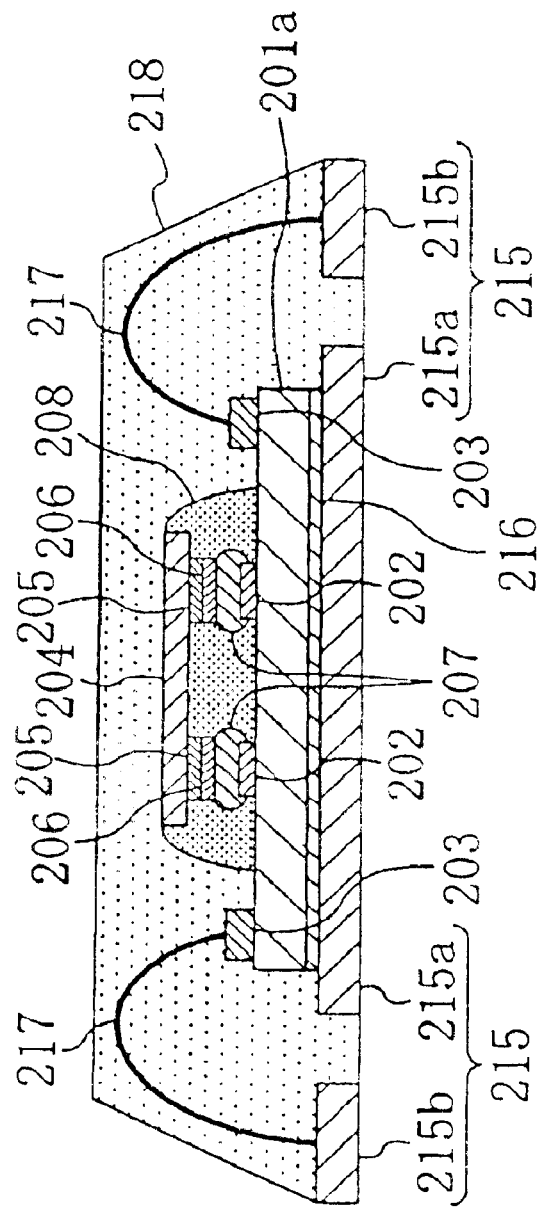
FIG. 17 is a sectional view showing one step in the method of manufacturing a semiconductor device according to the modification of the fourth embodiment.
Figure 18:
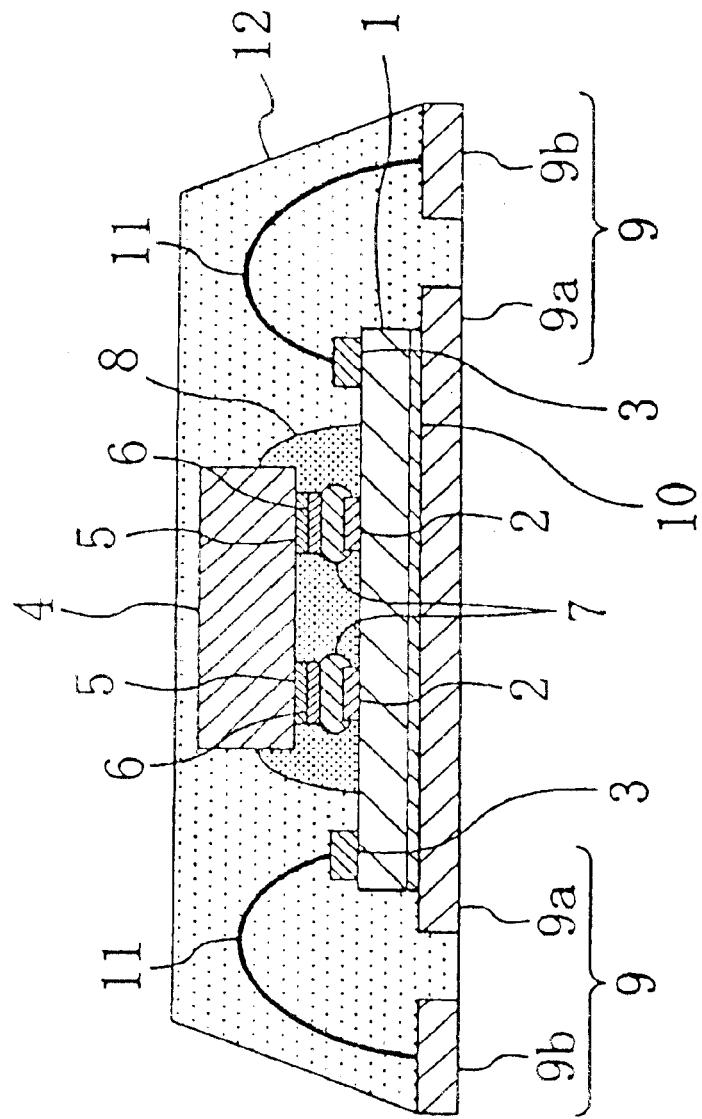
FIG. 18 is a sectional view of a conventional semiconductor device.
Figure 19A:
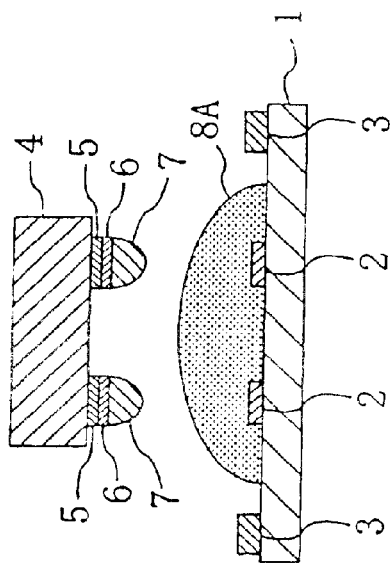
FIGS. 19A and 19B are sectional views showing steps in a method of manufacturing the conventional semiconductor device.
Figure 19B:
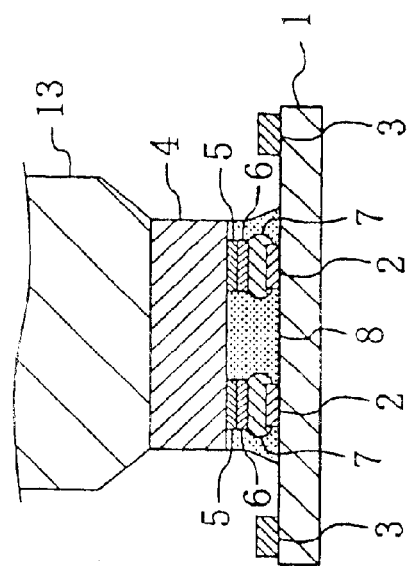
Figure 20A:
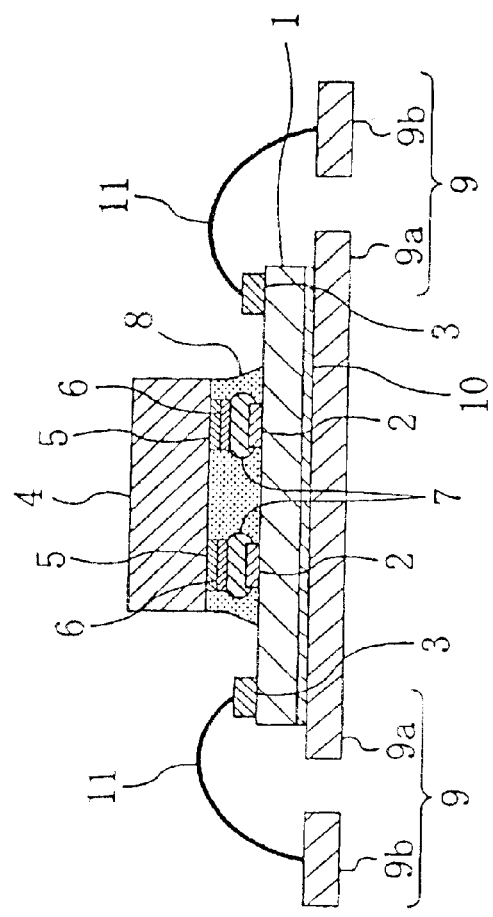
FIGS. 20A, and 20B are sectional views showing steps in the method of manufacturing the conventional semiconductor device.
Figure 20B:
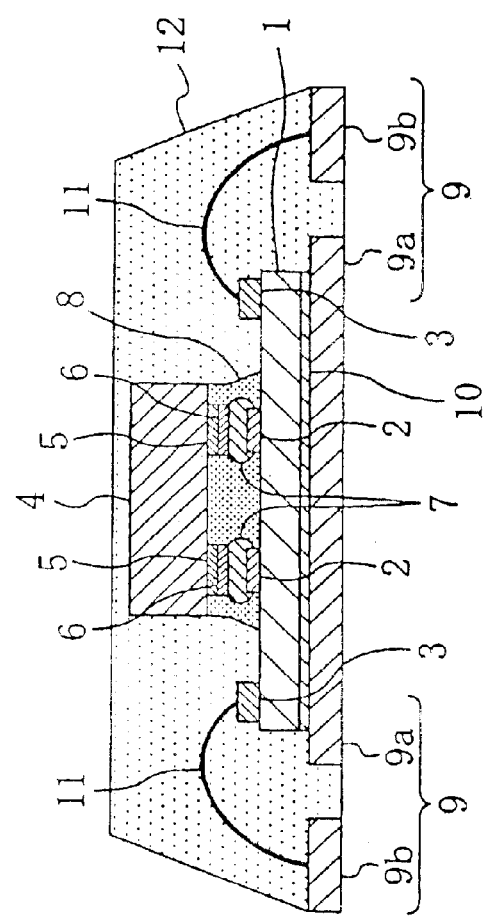

As shown in FIGS. 16B and 17, the chip-layered body 214 including the first semiconductor chip 201a and the second semiconductor chip 204 having a polished back surface joined with one another is subjected to die-bonding and wire-bonding and resin encapsulation. More specifically, a lead frame 215 having a die pad portion 215a and lead portions 215b is prepared. The back surface of the first semiconductor chip 201a of the chip-layered body 214 (the surface opposite to the first main surface) is secured on the die pad portion 215a, for example, with conductive paste 216 containing Pd, Ag or the like. Then, the bonding pads 203 on the first semiconductor chip 201a and the lead portions 215b are electrically connected through thin metal bonding wires 217. Here, the thin metal wire has a diameter of about 25 $\mu$m. The material of the thin metal wire may be Au, Al or the like.

According to the modification of the fourth embodiment, as shown in FIG. 17, the back surface of the second semiconductor chip 204 is polished so that the distance $T_{chip}$ from the first main surface of the first semiconductor chip 201a to the back surface of the second semiconductor chip 204 (the surface opposite to the second main surface) is smaller than the distance $T_{wb}$ from the first main surface of the first semiconductor chip 201a to the highest position of the bonding wire 217 (i.e., the peak of the loop of the bonding wire 217) on the first main surface. More specifically, the distance $T_{chip}$ is about in the range from 100 to 150 μm, and $T_{wb}$ is about in the range from 150 to 400 μm.

Finally, the first semiconductor chip 201a, the second semiconductor chip 204, the die pad portion 215a and lead portions 215b of the lead frame 215, and the bonding wires 217 are encapsulated in a resin package 218 of, for example, an epoxy-based resin or a polyimide-based resin. However, the bottom surface of the die pad portion 215a, and the bottom and outer side surfaces of the lead portions 215b are exposed out of the resin package 218, so that the bottom and outer side surfaces of the lead portions 215b serve as external terminals.

As in the foregoing, according to the modification of the fourth embodiment, the first and second semiconductor chips 201a and 204 are integrated to face to one another, and then the second semiconductor chip 204 is polished from the side opposite to the main surface (i.e., circuit forming surface), so that the second semiconductor chip 204 has a thickness smaller than the thickness of the first semiconductor chip 201a. As a result, the layered body (chip-layered body 214) of the first and second semiconductor chips 201a and 204 can have a reduced thickness. Therefore, the package structure including the chip-layered body 214 encapsulated in the resin package 218 can be made thinner, and the semiconductor device can have a reduced size and improved heat radiation property.

According to the modification of the fourth embodiment, the back surface of the second semiconductor chip 204 is polished so that the distance from the first main surface of the first semiconductor chip 201a to the back surface of the second semiconductor chip 204 is smaller than the distance from the first main surface of the first semiconductor chip 201a to the peak of the loop of the bonding wire 217. Therefore, if the chip-layered body 214 is placed on the lead frame 215 in the semiconductor device, the device may surely have a reduced size and improved heat radiation property.

According to the modification of the fourth embodiment, after the step of polishing the second semiconductor chip 204 from the back surface (see FIG. 16A), the second semiconductor chip 204 preferably has a thickness about ½ or less of the thickness of the first semiconductor chip 201a. In this way, the package structure including the chip-layered body 214 encapsulated in the resin package 218 can be made thinner, so that the semiconductor device can have a more reduced size and higher heat radiation property.

According to the modification of the fourth embodiment, the Sn—Pb alloy is used for the material of the metal bumps 207, while any one of Au, In, Cu, Ni, an In—Sn alloy, a Sn—Ag alloy, a Sn—Cu alloy and a Sn—Zn alloy may be used. The material used for electrical connection between the first and second electrodes 202 and 205 may be conductive paste, an anisotropic conductive resin or a resin having a metallic filler dispersed therein instead of the metal bumps 207.

According to the modification of the fourth embodiment, the metal bumps 207 are formed on the second electrodes 205 on the second semiconductor chip 204, while the metal bumps 207 may be formed on the first electrodes 202 on the first semiconductor chip 201a.

According to the modification of the fourth embodiment, the resin 208A is the epoxy resin, while an acrylic resin, a polyimide resin, a urethane resin or the like can be used. The resin 208A may be any of thermosetting, autopolymer, photosetting resin and the like. The resin 208A may preferably be applied by any of dispensing, printing and stamping methods and the like in consideration of the chip size and other conditions.

According to the modification of the fourth embodiment, the resin 208A is applied on the first main surface of the first semiconductor chip 201a, while the resin 208A may be applied on the second main surface of the semiconductor chip 204.

According to the modification of the fourth embodiment, the resin 208A is applied before joining the first and second electrodes 202 and 205 through the metal bumps 207, while the resin 208A may be applied in a different timing such as after joining these electrodes through the metal bumps 207.

According to the modification of the fourth embodiment, the resin 208A or resin layer 208 is interposed between the first main surface of the first semiconductor chip 201a and the second main surface of the second semiconductor chip 204, while an anisotropic conductive sheet, anisotropic conductive resin or the like may be interposed.

What is claimed is:

1. A method of manufacturing a semiconductor device comprising a first semiconductor chip provided with a first electrode on a first main surface and a second semiconductor chip provided with a second electrode on a second main surface, said method comprising:

a first step of integrating a semiconductor wafer to be a plurality of said first semiconductor chips and a plurality of discrete said second semiconductor chips by arranging said first main surface of each said first semiconductor chip in said semiconductor wafer to be opposed to said second main surface of each said second semiconductor chip and electrically connecting said first electrode on each said first semiconductor chip in said semiconductor wafer and said second electrode on each said second semiconductor chip;

a second step of polishing said second semiconductor chip integrated with said semiconductor wafer from an opposite side of said second main surface so that a thickness of each said second semiconductor chip is made smaller than a thickness of said semiconductor wafer and a third step of separating said semiconductor wafer integrated with said second semiconductor chips into a plurality of discrete said first semiconductor chips, thereby forming a plurality of chip-layered bodies each including a discrete said first semiconductor chip and a discrete said second semiconductor chip integrated with one another;

wherein an area of said first main surface is larger than an area of said second main surface, a third electrode is provided outside a region of said first main surface opposed to said second main surface, and after said third step, said chip-layered bodies are each subjected to the steps of adhering a surface of said first semiconductor chip opposite to said first main surface to a die pad; providing a lead adjacent to said die pad and electrically connecting said lead and said third electrode through a bonding wire; and forming a resin package to encapsulate said first semiconductor chip, said second semiconductor chip and the bonding wire, said second step comprises the step of arranging the distance from said first main surface of each said first semiconductor chip in said semiconductor wafer to a surface of each said second semiconductor chip opposite to said second main surface to be smaller than the distance from said first main surface of each said first semiconductor chip in said semiconductor wafer to the highest position of said bonding wire on said first main surface.

2. The method of manufacturing a semiconductor device according to claim 1, wherein
said first step comprises the step of forming a resin layer between said first main surface of each said first semiconductor chip in said semiconductor wafer and said second main surface of each said second semiconductor chip.

3. The method of manufacturing a semiconductor device according to claim 1, wherein
said second step comprises the step of reducing the thickness of each said second semiconductor chip to at most ½ of the thickness of said semiconductor wafer.

* * * * *